(12) United States Patent
Lee et al.

(10) Patent No.: US 9,767,873 B2
(45) Date of Patent: Sep. 19, 2017

(54) SEMICONDUCTOR MEMORY SYSTEM, SEMICONDUCTOR MEMORY DEVICE AND METHOD OF OPERATING THE SEMICONDUCTOR MEMORY DEVICE

(71) Applicant: SAMSUNG ELECTRONICS CO., LTD., Suwon-si, Gyeonggi-Do (KR)

(72) Inventors: Seonkyoo Lee, Hwaseong-si (KR);
Taesung Lee, Hwaseong-si (KR);
Jeongdon Ihm, Seongnam-si (KR);
Byunghoon Jeong, Hwaseong-si (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/198,564

(22) Filed: Jun. 30, 2016

(65) Prior Publication Data

US 2017/0053683 A1 Feb. 23, 2017

(30) Foreign Application Priority Data

Aug. 19, 2015 (KR) ........................ 10-2015-0116758

(51) Int. Cl.
*G11C 7/00* (2006.01)
*G11C 7/22* (2006.01)
*G11C 7/10* (2006.01)
*G06F 11/10* (2006.01)
*G11C 16/32* (2006.01)

(52) U.S. Cl.
CPC ................ *G11C 7/22* (2013.01); *G06F 11/10* (2013.01); *G11C 7/106* (2013.01); *G11C 7/1066* (2013.01); *G11C 7/1087* (2013.01); *G11C 7/1093* (2013.01); *G11C 16/32* (2013.01)

(58) Field of Classification Search
CPC ... G11C 7/1012; G11C 7/1066; G11C 7/1093; G11C 7/22
See application file for complete search history.

(56) References Cited

U.S. PATENT DOCUMENTS

| | | | | |
|---|---|---|---|---|
| 5,576,996 A | * | 11/1996 | Awaya | ..................... G11C 7/22 365/189.12 |
| 7,023,746 B2 | * | 4/2006 | Mizuhashi | ............... G11C 7/08 365/191 |
| 7,061,819 B2 | * | 6/2006 | Ikeda | .................... G11C 11/406 365/191 |
| 7,177,204 B2 | * | 2/2007 | Kim | ....................... G11C 29/02 365/191 |

(Continued)

FOREIGN PATENT DOCUMENTS

| | | |
|---|---|---|
| JP | 2010-010794 | 1/2010 |
| JP | 2013-187651 | 9/2013 |

(Continued)

*Primary Examiner* — Pho M Luu
(74) *Attorney, Agent, or Firm* — F. Chau & Associates, LLC

(57) ABSTRACT

A semiconductor device of the inventive concept includes a timing circuit configured to receive a first timing signal of a first pulse width from an external device and output a second timing signal having a pulse width which is gradually being reduced from a second pulse width longer than the pulse width of the first timing signal, and a data input/output circuit receiving the second timing signal and outputting data to the external device in synchronization with the second timing signal.

20 Claims, 12 Drawing Sheets

(56) References Cited

U.S. PATENT DOCUMENTS

| | | |
|---|---|---|
| 7,330,382 B2 | 2/2008 | Schaefer |
| 7,679,133 B2 | 3/2010 | Son et al. |
| 7,898,351 B2 | 3/2011 | Ito |
| 8,135,555 B2 | 3/2012 | Best |
| 8,553,466 B2 | 10/2013 | Han et al. |
| 8,559,235 B2 | 10/2013 | Yoon et al. |
| 8,638,153 B2 | 1/2014 | Ge et al. |
| 8,654,587 B2 | 2/2014 | Yoon et al. |
| 8,895,327 B1 * | 11/2014 | Kidd ............ H01L 27/088 438/17 |
| 2008/0143402 A1 | 6/2008 | Huang et al. |
| 2009/0066382 A1 | 3/2009 | Yousefzadeh et al. |
| 2011/0233648 A1 | 9/2011 | Seol et al. |
| 2012/0154005 A1 | 6/2012 | Frederiksen et al. |
| 2013/0120036 A1 | 5/2013 | Zhu et al. |
| 2013/0194051 A1 | 8/2013 | Zimlich et al. |
| 2014/0062551 A1 | 3/2014 | Bhaumik et al. |

FOREIGN PATENT DOCUMENTS

| | | |
|---|---|---|
| KR | 1020140093871 | 7/2014 |
| KR | 1020140139595 | 12/2014 |
| KR | 10-1480621 | 1/2015 |

* cited by examiner

SEMICONDUCTOR MEMORY SYSTEM, SEMICONDUCTOR MEMORY DEVICE AND METHOD OF OPERATING THE SEMICONDUCTOR MEMORY DEVICE

CROSS-REFERENCE TO RELATED APPLICATIONS

This U.S. non-provisional patent application claims priority under 35 U.S.C. §119 to Korean Patent Application No. 10-2015-0116758, filed on Aug. 19, 2015, the disclosure of which is incorporated by reference in its entirety herein.

BACKGROUND

1. Technical Field

The inventive concept relates to a semiconductor memory system, a semiconductor memory device and a method of operating the semiconductor memory device, and more particularly, to a semiconductor memory system including a nonvolatile memory device.

2. Discussion of Related Art

A storage device stores data according to a control of a host device such as a computer, a smart phone, a smart pad, etc. A storage device includes a device storing data in a magnetic disk like a HDD (hard disk drive), a semiconductor memory like a memory card, and more particularly, a device storing data in a nonvolatile memory.

A nonvolatile memory includes a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), etc.

However, high capacity and high speed of a storage device may hamper reliability of the storage device. For example, as the number of overlapping semiconductor chips increases, a resistance component also increases. However, if the resistance component increases too greatly, a signal waveform used to communicate with the semiconductor chips may collapse.

SUMMARY

According to an exemplary embodiment of the inventive concept, a semiconductor memory system includes a semiconductor memory device including memory blocks, and a memory controller configured to control the semiconductor memory device and transmit a first timing signal to the semiconductor memory device. The semiconductor memory device is configured to receive the first timing signal having a first pulse width and generate a second timing signal having a pulse width gradually reduced from a second pulse width longer than the first pulse width of the first timing signal, and then output the generated second timing signal to the memory controller.

According to an exemplary embodiment of the inventive concept, a semiconductor memory system includes a timing circuit configured to receive a first timing signal having a first pulse width from an external device and output a second timing signal having a pulse width gradually reduced from a second pulse width longer than the first pulse width of the first timing signal, and a data input/output circuit receiving the second timing signal and outputting data to the external device in synchronization with the second timing signal.

According to an exemplary embodiment of the inventive concept, a method of operating a semiconductor memory device includes an external device transmitting a first timing signal of a first pulse width to the semiconductor memory device, the semiconductor memory device generating a plurality of delay signals based on the first timing signal, the semiconductor memory device generating a second timing signal having a pulse width equal to the first pulse width of the first timing signal by gradually reducing a pulse width of the second timing signal from a second pulse width longer than the first pulse width of the first timing signal based on the first timing signal and the delay signals, and a step in which the semiconductor memory device outputs data to the external device according to the second timing signal.

According to an exemplary embodiment of the inventive concept, a semiconductor memory device includes a timing circuit configured to receive a first timing signal including pulses of a first pulse width from an external device and output a second timing signal sequentially including a first pulse having a second pulse width larger than the first pulse width and a plurality of second pulses of the first pulse width, and a data input/output circuit receiving the second timing signal and outputting data to the external device in synchronization with the second timing signal.

BRIEF DESCRIPTION OF THE FIGURES

Embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

DETAILED DESCRIPTION

Figure 1:
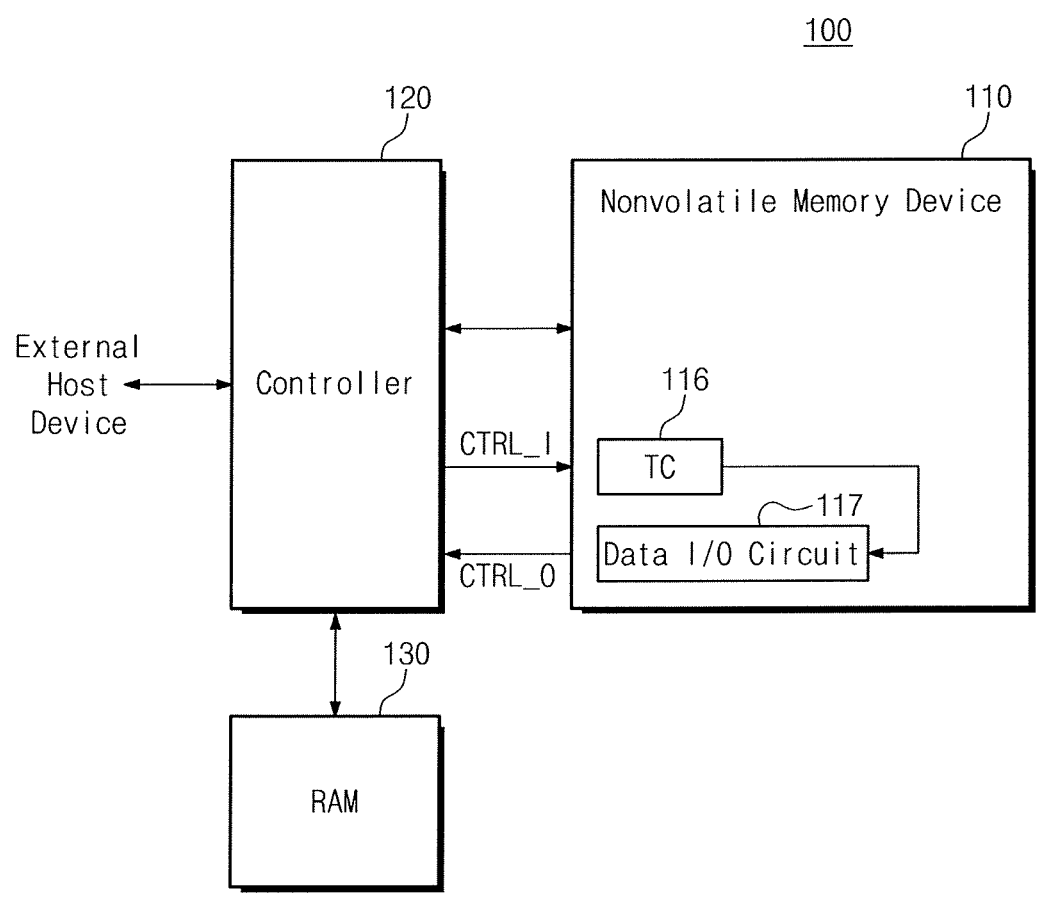
FIG. 1 is a block diagram illustrating a storage device in accordance with an exemplary embodiment of the inventive concept.

Embodiments of inventive concepts will be described more fully hereinafter with reference to the accompanying drawings, in which embodiments of the invention are shown. This inventive concept may, however, be embodied in many different forms and should not be construed as limited to the embodiments set forth herein. Rather, these embodiments are provided so that this disclosure will be thorough and complete, and will fully convey the scope of the inventive concept to those skilled in the art. In the drawings, the size and relative sizes of layers and regions may be exaggerated for clarity. Like numbers refer to like elements throughout. It will be understood that when an element is referred to as being "connected" or "coupled" to another element, it can be directly connected or coupled to the other element or intervening elements may be present. As used herein, the singular forms "a", "an", and "the" are intended to include the plural forms as well, unless the context clearly indicates otherwise.

A system that does not generate an internal operation clock signal, and instead uses an external clock signal applied from a source located outside the system may be referred to as source synchronous system. The external clock signal may be provided by a phase locked loop (PLL) or a delay locked loop (DLL). The inventive concept relates to a semiconductor memory device or a semiconductor memory system embodied by a source synchronous system, and more particularly, to a semiconductor memory system including a nonvolatile memory device.

For brevity of description, a semiconductor memory device is referred to as a nonvolatile memory device and a semiconductor memory system including the nonvolatile memory device is referred to as a storage device.

However, the inventive concept is not limited to the nonvolatile memory device or the storage device. For example, the inventive concept may be applied to a volatile memory or to an asynchronous system including a memory device that generates its own internal clock signal.

FIG. 1 is a block diagram illustrating a storage device 100 in accordance with an exemplary embodiment of the inventive concept.

Referring to FIG. 1, the storage device 100 includes a nonvolatile memory device 110, a controller 120 (e.g., a memory controller) and a RAM 130.

The nonvolatile memory device 110 can perform write, read and erase operations under the control of the controller 120. The nonvolatile memory device 110 can receive a command (e.g., a write command, read command, a delete command, etc.) and an address from the controller 120 through an input/output channel. The nonvolatile memory device 110 can exchange data with the controller 120 through the input/output channel.

The nonvolatile memory device 110 can exchange a control signal CTRL with the controller 120 through a control channel. For example, the nonvolatile memory device 110 can receive a chip enable signal CE selecting at least one nonvolatile memory chip among a plurality of memory chips of the nonvolatile memory device 110, a command latch enable signal CLE indicating that a signal being received from the controller 120 through the input/output channel is a command, an address latch enable signal ALE indicating that a signal being received from the controller 120 through the input/output channel is an address, a read enable signal RE that is generated by the controller 120 in a read operation and periodically toggled to be used to adjust timing, a write enable signal WE being activated by the controller 120 when a command or an address is transmitted, a write preventing signal /WP being activated by the controller 120 to prevent an unwanted write or erase when a power supply is changed, and a data strobe signal DQS that is generated by the controller 120 in a write operation and periodically toggled to be used to adjust a sync of data being transmitted through the input/output channel. For example, the data strobe signal DQS may indicate when the data is valid. For example, the nonvolatile memory device 110 can output a ready & busy signal R/nB to the controller 120 indicating that the nonvolatile memory device 110 is performing a program, erase or read operation. The nonvolatile memory device 110 can also output a data strobe signal DQS to the controller 120 that is generated from the read enable signal RE by the nonvolatile memory device 110 and periodically toggled to be used to adjust an output sync of data.

In an embodiment, the nonvolatile memory device 110 includes a timing circuit (TC) 116 and a data I/O (input/output) circuit 117. In an embodiment, the timing circuit 116 receives a first timing signal CTRL_I among control signals and outputs a second timing signal CTRL_O to the data I/O (input/output) circuit 117 based on the first timing signal CTRL_I. In an embodiment, the data I/O (input/output) circuit 117 outputs the received second timing signal CTRL_O to the controller 120.

The nonvolatile memory device 110 can output a data signal synchronized with the second timing signal CTRL_O to the controller 120. For example, the first timing signal CTRL_I may be a read enable signal RE and the second timing signal CTRL_O may be a data strobe signal DQS. For example, the first timing signal CTRL_I may be a data strobe signal DQS and the second timing signal CTRL_O may be a signal in which a pulse width of the received data strobe signal DQS is modulated.

An internal structure of the timing circuit 116 will be described in further detail with reference to FIGS. 2 and 3.

The nonvolatile memory device 110 may include a flash memory. However, the nonvolatile memory device 110 is not limited to include only a flash memory. The nonvolatile memory device 110 may include at least one among various types of volatile memory devices such as a phase-change RAM (PRAM), a magnetic RAM (MRAM), a resistive RAM (RRAM), a ferroelectric RAM (FeRAM), etc.

The controller 120 is configured to control the nonvolatile memory device 110. For example, the controller 120 can control the nonvolatile memory device 110 through the input/output and control channels so that the nonvolatile memory device 110 performs a write, read or erase operation.

The controller 120 can control the nonvolatile memory device 110 according to a control of an external host device (not illustrated). For example, the controller 120 can communicate with the external host device according to a format different from a format used when the controller 120 communicates with the nonvolatile memory device 110. A data unit by which the controller 120 communicates with the nonvolatile memory device 110 may be different from a data unit by which the controller 120 communicates with the external host device.

The controller 120 can use the RAM 130 as a buffer memory, a cache memory, or an operation memory. The controller 120 can store data or a code needed to manage the nonvolatile memory device 110 in the RAM 130. For example, the controller 120 can read data or a code needed to manage the nonvolatile memory device 110 from the nonvolatile memory device 110 and can load the data or code into the RAM to drive it. For example, the code may be executable code that operates on the data.

The RAM 130 may include at least one among various types of random access memory devices such as a dynamic RAM (DRAM), a static RAM (SRAM), a synchronous DRAM (SRAM), a phase-change RAM (PRAM), a magnetic RAM (MRAM), a resistive RAM (RRAM), a ferroelectric RAM (FeRAM), etc.

The nonvolatile memory device 110 may include a plurality of nonvolatile memory chips. The controller 120 and the nonvolatile memory chips are connected to one another through one or more channels. One channel may include one data channel and one control channel. One data channel may include 8 data lines. One control channel may include control lines that transmit the chip enable signal CE, the command latch enable signal CLE, the address latch enable signal ALE, the read enable signal /RE, the write enable signal AYE, the write preventing signal /WP, and the ready & busy signal R/nB that are described above.

Nonvolatile memory chips connected to one channel may form a way. If n number of nonvolatile memory chips is connected to one channel, an n-way may be formed. Nonvolatile memory chips that belong to one way can share data lines and control lines that transmit the command latch enable signal CLE, the address latch enable signal ALE, the read enable signal RE, the write enable signal WE, and the write preventing signal WP. Each of nonvolatile memory chips that belong to one way can communicate with the controller 120 through an exclusive control line that transmits the chip enable signal CE, the command latch enable signal CLE and the ready & busy signal R/nB. For example, if a first set of nonvolatile memory chips of the nonvolatile memory device 110 is connected to a first channel (e.g., a first 3-way), and a second set of the chips are connected to a second channel (e.g., a second N-way), the controller 120 is connected to a first exclusive control line for outputting CE, CLE, and R/nB to the first set and to a second exclusive control line for outputting CE, CLE, and R/nB to the second set.

The controller 120 can alternately access nonvolatile memory chips of an n-way that are connected to one channel. The controller 120 can independently access nonvolatile memory chips connected to different channels from one another. The controller 120 can alternately or simultaneously access nonvolatile memory chips connected to different channels. For example, the controller 120 can access the first set during a first time period and the second set during a second time period after the first time period, or the controller 120 can access both sets at the same time.

Volatile memory chips can be connected to the controller 120 in a wide TO form (e.g., an N-wide I/O path). For example, nonvolatile memory chips connected to different channels can share a control line of one chip enable signal CE. The nonvolatile memory chips sharing the control line of one chip enable signal CE may be accessed at the same time. Since data lines of different channels are used at the same time, a wide input/output bandwidth may be accomplished. For example, nonvolatile memory chips connected to different channels can share a control line that is used for transmitting a chip enable signal CE.

The storage device 100 may include a solid state drive (SSD) or a hard disk drive (HDD). The storage device 100 may include memory cards such as a personal computer memory card international association (PCMCIA) card, a compact flash (CF) card, a smart media card (SM, SMC), a memory stick, a multimedia card (MMC, RS-MMC, MMC-micro), a SD card (SD, miniSD, microSD, SDHC), a universal serial bus (USB) memory card, a universal flash storage (UFS), etc. The storage device 100 may include a mounting type memory such as an embedded multimedia card (eMMC), a UFS, a perfect page NAND (PPN), etc.

In FIG. 1, it is illustrated that the storage device 100 includes the RAM 130 disposed outside the controller 120. However, the RAM 130 needs not to be disposed outside the controller 120 in the storage device 100. In an embodiment, the RAM is double data rate synchronous DRAM (DDR) memory. The controller 120 may be configured to use an internal RAM as a buffer memory, an operation memory or a cache memory.

Figure 2:
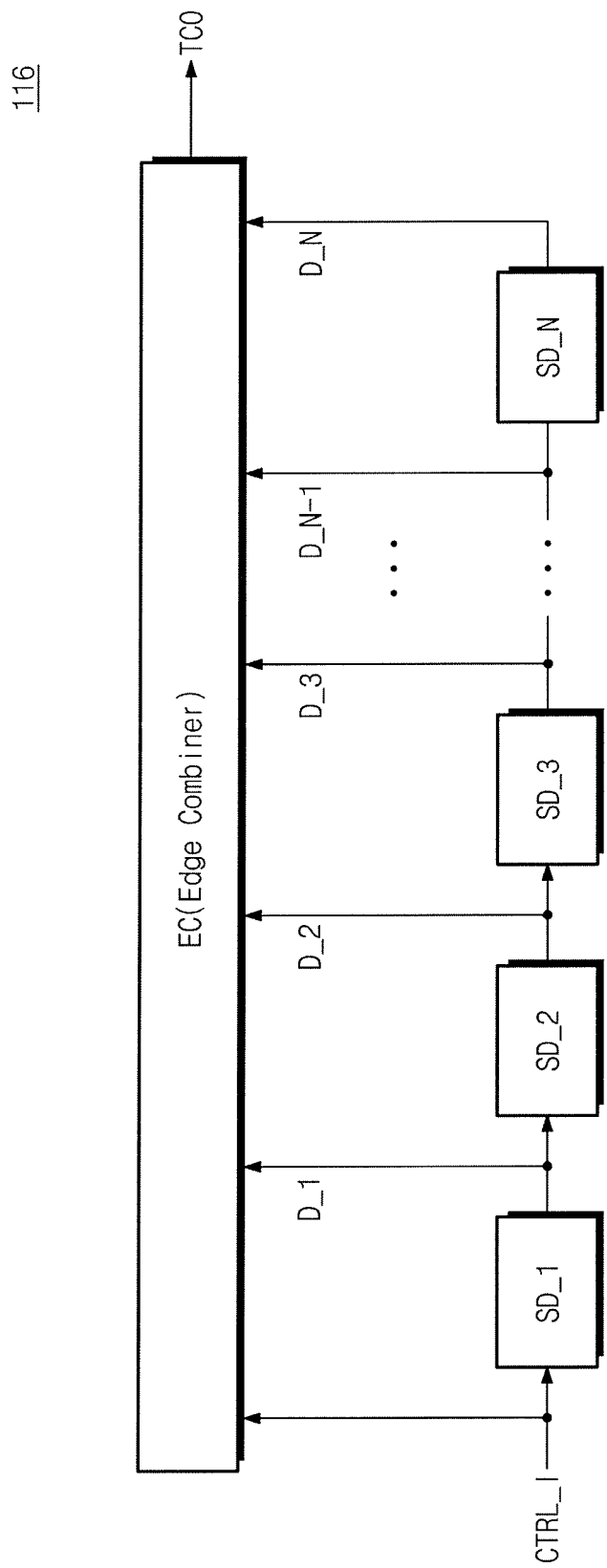
FIG. 2 is a block diagram illustrating a timing circuit in accordance with an exemplary embodiment of the inventive concept.

FIG. 2 is a block diagram illustrating a timing circuit in accordance with an exemplary embodiment of the inventive concept.

Referring to FIGS. 1 and 2, the timing circuit 116 includes a plurality of time delay circuits SD_1-SD_N and an edge combiner (EC) (e.g., an edge combiner circuit).

For example, a first time delay circuit SD_1 can receive the first timing signal CTRL_I and then can delay the received first timing signal CTRL_I by a first delay time d1 to generate a first delay signal D_1. The first time delay circuit SD_1 can output the first delay signal D_1 to a second time delay circuit SD_2 and the edge combiner (EC).

The second time delay circuit SD_2 serially connected to the first time delay circuit SD_1 can receive the first delay signal D_1 and then can delay the received first delay signal D_1 by a second delay time d2 to generate a second delay signal D_2. The second time delay circuit SD_2 can output the second delay signal D_2 to a third time delay circuit SD_3 and the edge combiner (EC).

The third time delay circuit SD_3 serially connected to the second time delay circuit SD_2 can receive the second delay signal D_2 and then can delay the received second delay signal D_2 by a third delay time d3 to generate a third delay signal D_3. The third time delay circuit SD_3 can output the third delay signal D_3 to a fourth time delay circuit SD_4 and the edge combiner (EC).

Similarly, an Nth time delay circuit SD_N serially connected to an N−1 time delay circuit SD_N−1 can receive an N−1 delay signal D_N−1 and then can delay the received N−1 delay signal D_N−1 by an Nth delay time dN to generate an Nth delay signal D_N. The Nth time delay circuit SD_N can output the Nth delay signal D_N to the edge combiner (EC).

The time delay circuits SD_1-SD_N may have different delay times d1-dN respectively. For example, the first delay time d1 may be set to be longer than the second delay time d2 and the second delay time d2 may be set to be longer than the third delay time d3. That is, as the first time signal CTRL_I received at the first time delay circuit SD_1 passes through the time delay circuits SD_1-SD_N, the delay times d1-dN of the time delay circuits SD_1-SD_N may be set to become sequentially reduced. In an embodiment, each of the time delay circuits SD_1-SD_N are buffers, which could be implemented by operational amplifiers.

The edge combiner EC can output a timing output signal TCO based on the first timing signal CTRL_I and the first through Nth delay signals D_1~D_N being output from the first through Nth time delay circuits SD_1~SD_N.

Figure 3:
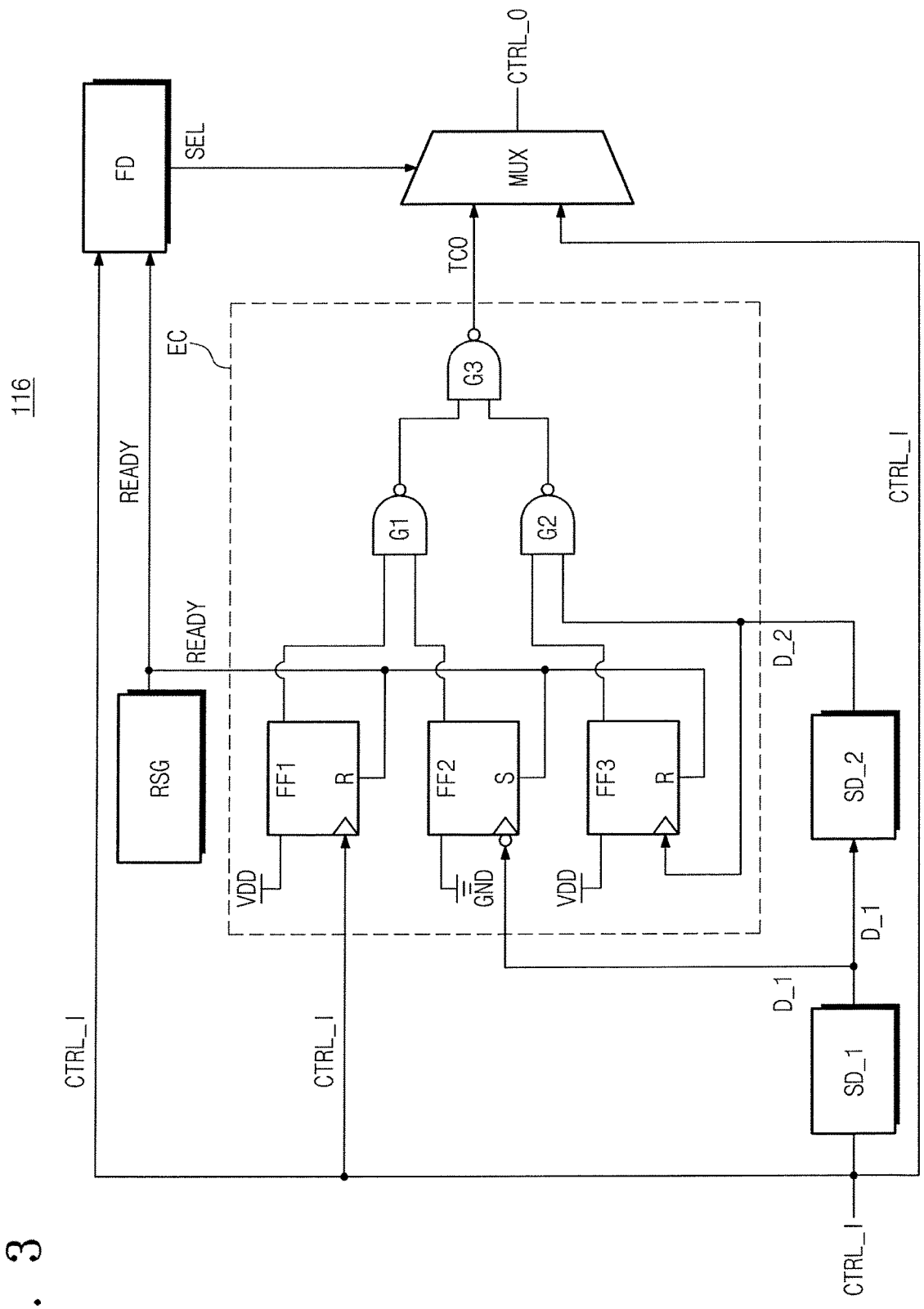
FIG. 3 is a circuit diagram illustrating a timing circuit in accordance with an exemplary embodiment of the inventive concept.

FIG. 3 is a circuit diagram illustrating a timing circuit 116 in accordance with an exemplary embodiment of the inventive concept. An example of the case that N is 2 is illustrated.

Referring to FIGS. 1 through 3, the timing circuit 116 may include first and second delay circuits SD_1 and SD_2, an edge combiner EC (e.g., edge combiner circuit) including first through third flip-flops FF1, FF2 and FF3 and first through third gates G1, G2 and G3, a ready signal generator (RSG), a falling detector (FD) and a multiplexer MUX.

The first time delay circuit SD_1 can delay the received first timing signal CTRL_I by the first delay time d1 to generate the first delay signal D_1. The first time delay circuit SD_1 can output the first delay signal D_1 to the second time delay circuit SD_2 and the internal second flip-flop FF2 of the edge combiner EC. For example, a clock terminal of the second flip-flop FF2 may receive the first delay signal D_1. Subsequently, the second time delay circuit SD_2 can delay the received first delay signal D_1 by the second delay time d2 to generate the second delay signal D_2. The second time delay circuit SD_2 can output the second delay signal D_2 to the internal third flip-flop FF3 and the internal second gate G2 of the edge combiner EC. For example, a clock terminal of the third flip-flop FF3 may receive the second delay signal D_2. In an exemplary embodiment, the first delay signal D_1 is delayed ½ period as compared to the first timing signal CTRL_I, and the second delay signal D_2 is delayed ¾ period as compared with the first timing signal CTRL_I.

When a level of the first timing signal CTRL_I remains constant for more than a certain period of time, the ready signal generator (RSG) can output a ready signal READY. The ready signal READY may be transmitted to a reset terminal R (e.g., an asynchronous reset terminal) of the first flip-flop FF1, a set terminal S (e.g., an asynchronous set terminal) of the second flip-flop FF2, a reset terminal R (e.g., an asynchronous reset terminal) of the third flip-flop FF3, and the falling detector (FD).

The first flip-flop FF1 can output a signal generated based on the first timing signal CTRL_I and a power supply voltage VDD to the first gate G1. For example, the first flip-flop FF1 may be a rising edge trigger D flip-flop. In this case when the ready signal READY is input to a reset terminal R (e.g., an asynchronous reset terminal), an output value of the first flip-flop FF1 is initialized to 0. The output value of the first flip-flop FF1 maintains 0 until a rising edge of the first timing signal CTRL_I is received. Subsequently, the first flip-flop FF1 can transmit an input signal to an output terminal in response to the rising edge of the first timing signal CTRL_I. In this case, since the input signal is the power supply voltage VDD, the output value of the first flip-flop FF1 can maintain 1 until the ready signal READY is re-input.

The second flip-flop FF2 can output the first delay signal D_1 and a signal generated based on a ground voltage signal GND to the first gate G1. For example, the second flip-flop FF2 may be a falling edge trigger D flip-flop. In this case, when the ready signal READY is input to a set terminal S (e.g., a asynchronous set terminal), an output value of the second flip-flop FF2 is initialized to 1. The output value of the second flip-flop FF2 maintains 1 until a falling edge of the first delay signal D_1 is received. Subsequently, the second flip-flop FF2 can transmit an input signal to an output terminal in response to the falling edge of the first delay signal D_1. In this case, since the input signal is the ground voltage signal GND, the output value of the second flip-flop FF2 can maintain 0 until the ready signal READY is re-input.

The third flip-flop FF3 can output the second delay signal D_2 and a signal generated based on the power supply voltage VDD to the second gate G2. For example, the third flip-flop FF3 may be a rising edge trigger D flip-flop. In this case, when the ready signal READY is input to a reset terminal R (e.g., an asynchronous reset terminal), an output value of the third flip-flop FF3 is initialized to 0. The output value of the third flip-flop FF3 maintains 0 until a rising edge of the second delay signal D_2 is received. Subsequently, the third flip-flop FF3 can transmit an input signal to an output terminal in response to the rising edge of the second delay signal D_2. In this case, since the input signal is the power supply voltage VDD, the output value of the third flip-flop FF3 can maintain 1 until the ready signal READY is re-input.

The first gate G1 can output a result value obtained by performing a logical operation based on an output value of the first flip-flop FF1 and an output value of the second flip-flop FF2 to the third gate G3. The second gate G2 can output a result value to the third gate G3 obtained by performing a logical operation on an output value of the third flip-flop FF3 and the second delay signal D_2te G3. The third gate G3 can output a timing output signal TCO to the multiplexer MUX obtained by performing a logical operation on an output value of the first gate G1 and an output value of the second gate G2. For example, the first through third gates G1-G3 may be NAND logic gates.

The falling detector FD can output a selection signal SEL based on the ready signal READY and the first timing signal CTRL_I. For example, the falling detector FD can output the selection signal SEL at a low state until a first falling edge of the first timing signal CTRL_I is applied after receiving the ready signal READY. The falling detector FD can also output the selection signal SEL at a high state until the ready signal READY is re-input after the first falling edge of the first timing signal CTRL_I is applied.

The multiplexer MUX selects one of the first timing signal CTRL_I and the timing output signal TCO according to the selection signal SEL to output a second timing signal CTRL_O. For example, in the case that the selection signal SEL is at a low state, the multiplexer MUX can output the first timing signal CTRL_I as the second timing signal CTRL_O. In the case that the selection signal SEL is at a high state, the multiplexer MUX can output the timing output signal TCO as the second timing signal CTRL_O.

If a level of the first timing signal CTRL_I remains constant for more than a certain period of time, the ready signal generator (RSG) can generate the ready signal READY. The ready signal generator (RSG) can output the ready signal READY to the first through third flip-flops FF1-FF3 and the falling detector FD at the same time. The ready signal generator (RSG) will be described in further detail with reference to FIGS. 5 and 6.

Figure 4:
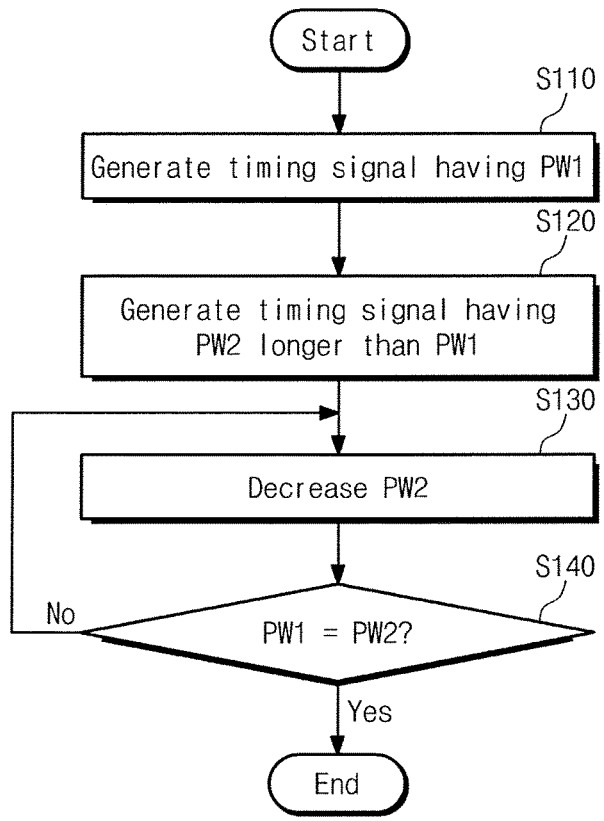
FIG. 4 is a flowchart illustrating a method of operating a storage device in accordance with an exemplary embodiment of the inventive concept.

FIG. 4 is a flowchart illustrating a method of operating a storage device 100 in accordance with an exemplary embodiment of the inventive concept.

Referring to FIGS. 1 and 4, in an operation S110, the controller 120 outputs the first timing signal CTRL_I to the nonvolatile memory device 110. For example, the first timing signal CTRL_I may be a signal having a first pulse width PW1. For example, referring to FIG. 7, if a period of the first timing signal CTRL_I is T, then the duration of the first pulse width PW1 would be T/2.

The controller 120 can output the first timing signal CTRL_I to the nonvolatile memory device 110 for reading data from a memory block of the nonvolatile memory device 110 selected according to a request of an external host device or an internal schedule. For example, the first timing signal CTRL_I may be a read enable signal RE being toggled by the controller 120.

In an operation S120, the nonvolatile memory device 110 receives the first timing signal CTRL_I and outputs a second timing signal CTRL_O having a second pulse width PW2 longer than the first pulse width PW1 to the controller 120 based on the received first timing signal CTRL_I. For example, referring to FIG. 7, after tPRE, the second timing signal CTRL_O includes a second pulse width PW2 having a duration of T/2+d1.

The first timing signal CTRL_I may be applied to the timing circuit (TC) 116 disposed inside the nonvolatile memory device 110. For example, in the case that the first timing signal CTRL_I is a read enable signal RE, the timing circuit (TC) 116 receives a read enable signal RE and outputs the second timing signal CTRL_O having a pulse width longer than the read enable signal RE to the data input/output circuit 117 based on the received read enable signal RE. The input/output circuit 117 receives the second timing signal CTRL_O, and may output the received second timing signal CTRL_O to the controller 120 as it is. In an embodiment, the input/output circuit 117 adjusts the received second timing signal CTRL_O to have a high impedance period Hi-z and outputs the adjusted signal to the controller 120.

Figure 7:
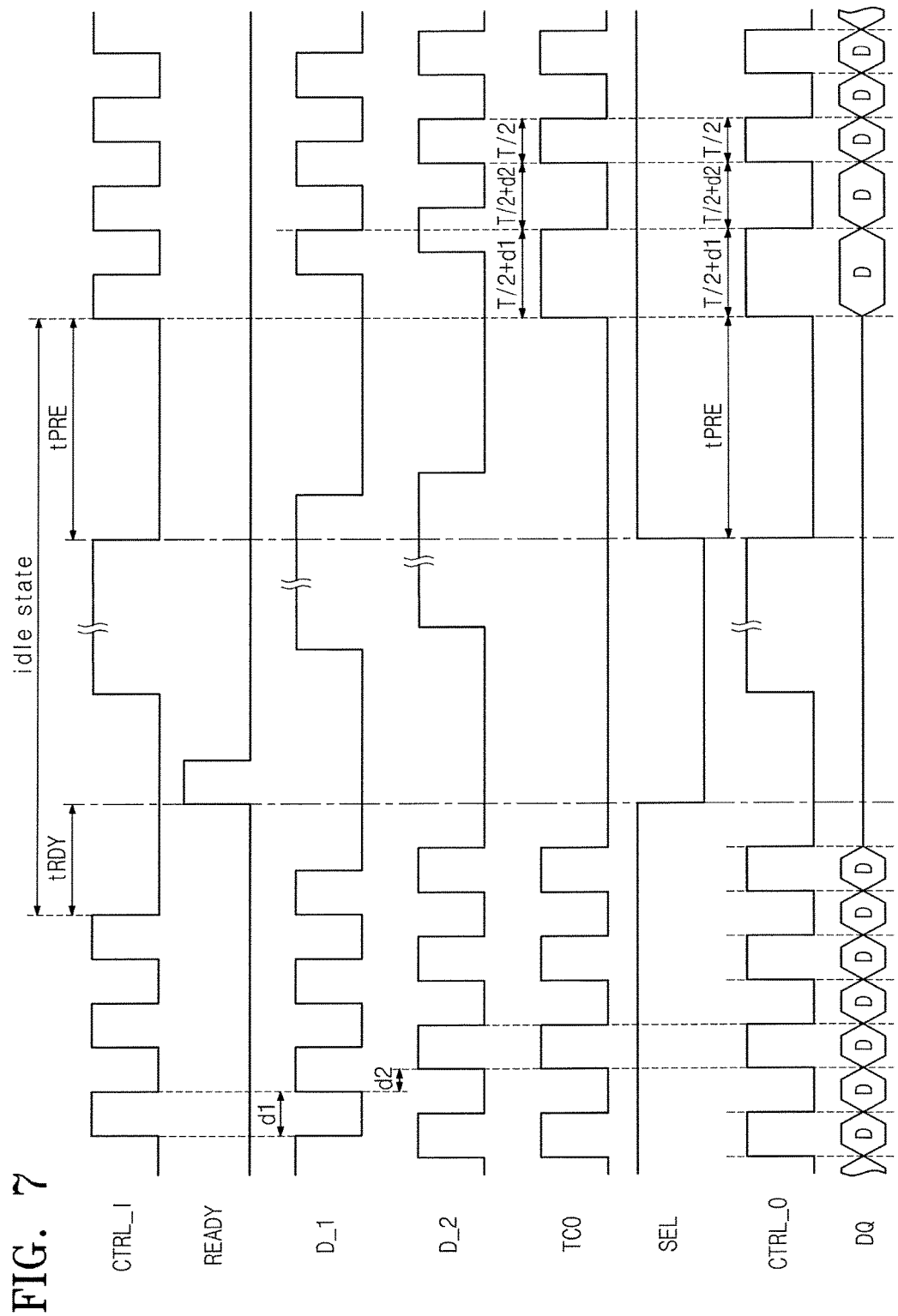
FIG. 7 is a timing diagram illustrating signals which are input to and output from a nonvolatile memory device including a timing circuit in accordance with an exemplary embodiment of the inventive concept.

In an operation S130, the nonvolatile memory device 110 outputs the second timing signal CTRL_O to the controller 120 so that a pulse width gradually decreases from the second pulse width PW2. For example, as shown in FIG. 7, the pulse width of CTRL_O decreases from a duration of T/2+d1 to T/2+d2, and then from T/2+d2 to T/2.

For example, in the case that the first timing signal CTRL_I is the read enable signal RE, the timing circuit (TC) 116 can output the second timing signal CTRL_O to the input/output circuit 117 so that a pulse width gradually decreases from the pulse width longer than a pulse width of the received read enable signal RE. The input/output circuit 117 receives the second timing signal CTRL_O, and directly outputs the received second timing signal CTRL_O to the controller 120 or makes the received second timing signal CTRL_O have a high impedance period Hi-z to output it to the controller 120.

In an operation S140, the nonvolatile memory device 110, outputs the second timing signal CTRL_O having a pulse width which is the same as the pulse width PW1 of the first timing signal CTRL_I to the controller 120 by gradually reducing the second pulse width PW2 of the second timing signal CTRL_O. If the second pulse width PW2 of the second timing signal CTRL_O is not the same as the pulse width PW1 of the first timing signal CTRL_I, the nonvolatile memory device 110 may perform the operation S130 again.

If the second pulse width PW2 of the second timing signal CTRL_O is the same as the first pulse width PW1 of the first timing signal CTRL_I, the nonvolatile memory device 110 does not reduce the second pulse width PW2 of the second timing signal CTRL_O any more to maintain the second pulse width PW2 of the second timing signal CTRL_O.

Figure 5:
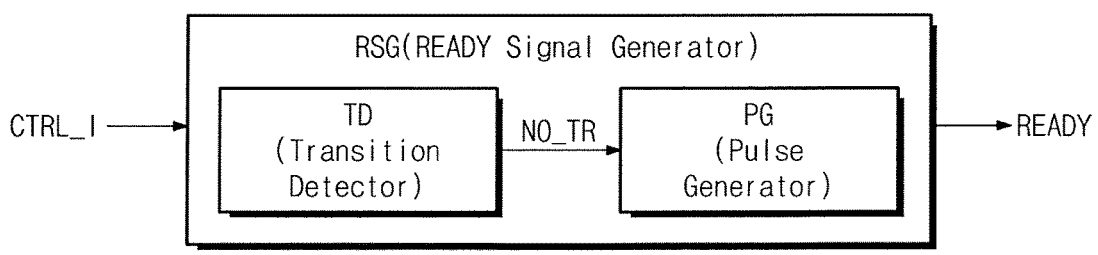
FIG. 5 is a block diagram illustrating a ready signal generator in accordance with an exemplary embodiment of the inventive concept.

FIG. 5 is a block diagram illustrating a ready signal generator (RSG) in accordance with an exemplary embodiment of the inventive concept.

Referring to FIG. 5, the ready signal generator (RSG) receives a first timing signal CTRL_I and outputs a ready signal READY according to the first timing signal CTRL_I. The ready signal generator (RSG) includes a transition detector (TD) and a pulse generator (PG).

If a level of the first timing signal CTRL_I does not transit and remains constant for more than a certain period of time, the transition detector (TD) can output a non-transition signal NO_TR.

The pulse generator (PG) receives the non-transition signal NO_TR and can output the ready signal READY based on the received non-transition signal NO_TR. As described above, the ready signal READY may be applied to the first through third flip-flops FF1~FF3 at the same time. An operation process of the ready signal generator (RSG) will be described in further detail with reference to FIG. 6.

Figure 6:
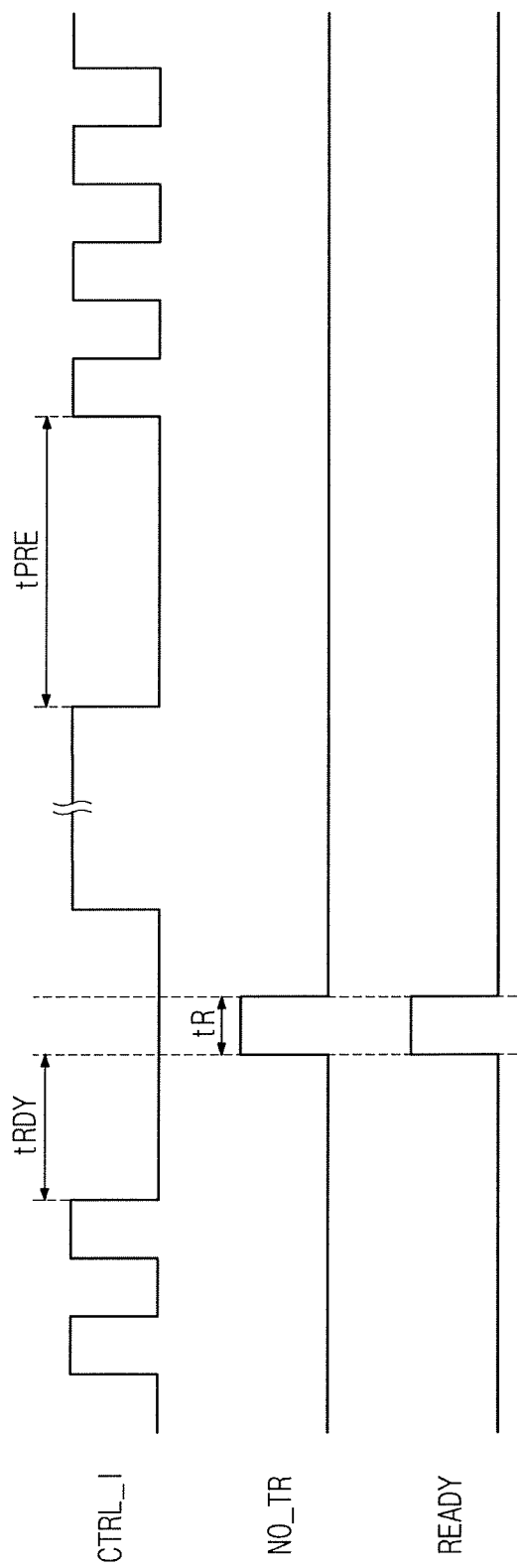
FIG. 6 is a timing diagram of signals which are input to and output from a ready signal generator in accordance with an exemplary embodiment of the inventive concept.

FIG. 6 is a timing diagram of signals which are input to and output from a ready signal generator in accordance with an exemplary embodiment of the inventive concept.

Referring to FIGS. 5 and 6, when a level of the first timing signal CTRL_I remains constant for more than a certain period of time (tRDY), a level of the non-transition signal NO_TR is changed during a transition time tR. For example, the level of the first timing signal CTRL_I of FIG. 6 can remain at a low level for more than a certain period of time (tRDY). At this time, a level of the non-transition signal NO_TR rises to a high level during the transition time tR. For example, the ready signal READY may be generated through a process in which the ready signal READY rises to a high level in synchronization with a rising edge of the non-transition signal NO_TR and then falls to a low level in synchronization with a falling edge of the non-transition signal NO_TR.

FIG. 7 is a timing diagram illustrating signals which are input to and output from a nonvolatile memory device 110 including a timing circuit 116 in accordance with an exemplary embodiment of the inventive concept. Synchronization signals among signals being input to and output from the nonvolatile memory device 110 may not necessarily be output at the same time or may be delayed compared with a previous signal to be output.

Referring to FIGS. 1 through 7, the first timing signal CTRL_I is a signal received from the controller 120 and may have a preamble period tPRE. For example, the first timing signal CTRL_I may be a read enable signal /RE toggled by the controller 120. The nonvolatile memory device 110 can recognize that a signal having a specific period T and a specific waveform will be input according to the preamble period tPRE. In FIG. 7, the preamble period tPRE of the first timing signal CTRL_I is set to a low level but may be set to a high level depending on a driving method.

The ready signal READY may be generated if a level of the first timing signal CTRL_I remains constant for more than a certain period of time (tRDY). The ready signal READY, as mentioned in FIGS. 5 and 6, is generated based on the first timing signal CTRL_I received in the ready signal generator RSG. The ready signal READY may be output to the first through third flip flops FF1~FF3 inside the edge combiner (EC) at the same time.

The first delay signal D_1 is a signal generated by delaying the first timing signal CTRL_I received in the first time delay circuit SD_1 by the first delay time d1. For example, in the case of FIG. 7, the first delay time d1 may correspond to half of a period T of the first timing signal CTRL_I.

The second delay signal D_2 is a signal generated by delaying the first delay signal D_1 received in the second time delay circuit SD_2 by the second delay time d2. For example, in the case of FIG. 7, the second delay time d2 may correspond to half of the first delay time d1.

However, the first delay time d1 and the second delay time d2 are not limited thereto and may be differently set depending on embodiments.

The timing output signal TCO may be a signal generated based on the first timing signal CTRL_I received in the edge combiner (EC) and the first and second delay signals D_1 and D_2 output from the first and second time delay circuits SD_1 and SD_2.

For example, a level of the timing output signal TCO rises in synchronization with a rising edge of the first timing signal CTRL_I, falls in synchronization with a falling edge of the first delay signal D_1 and rises in synchronization with a rising edge of the second delay signal D_2. After that, a level of the timing output signal TCO may increase or decrease while maintaining its pulse width the same as a pulse width of the first timing signal CTRL_I.

That is, a duration time of a first high level of the timing output signal TCO remains longer than a duration time (T/2) of a high level of the first timing signal CTRL_I by the first delay time d1 and duration time of a low level of the timing output signal TCO remains longer than duration time (T/2) of a low level of the first timing signal CTRL_I by the second delay time d2. After that, a duration time of the timing output signal TCO remains the same as the duration time (T/2) of the high and low levels of the first timing signal CTRL_I.

The selection signal SEL may be generated based on the first timing signal CTRL_I and the ready signal READY received in the falling detector FD. For example, the selection signal SEL may be output at a low state until a first falling edge of the first timing signal CTRL_I is applied after receiving the ready signal READY. The selection signal SEL may be output at a high state until the ready signal READY is received again after the first falling edge of the first timing signal CTRL_I is applied.

The second timing signal CTRL_O may be a signal generated based on the first timing signal CTRL_I and the timing output signal TCO received in the multiplexer MUX according to the selection signal SEL. For example, in the case that a level of the selection signal SEL is high, the multiplexer MUX can output the timing output signal TCO as the second timing signal CTRL_O. In the case that a level of the selection signal SEL is low, the multiplexer MUX can output the first timing signal CTRL_I as the second timing signal CTRL_O. The second timing signal CTRL_O may be output as it is or due to the nature of the signal, the second timing signal CTRL_O may be output while having a high impedance period (Hi-z).

In the case of FIG. 7, the first timing signal CTRL_I may be a read enable signal RE toggled by the memory controller 120 in a read operation of the nonvolatile memory device 110, and the second timing signal CTRL_O may be a data strobe signal DQS, which the nonvolatile memory device 110 generates based on the read enable signal RE in a read operation. The nonvolatile memory device 110 can output a read data signal DQ to the controller 120 in synchronization with the second timing signal CTRL_O, that is, the data strobe signal DQS.

Figure 8:
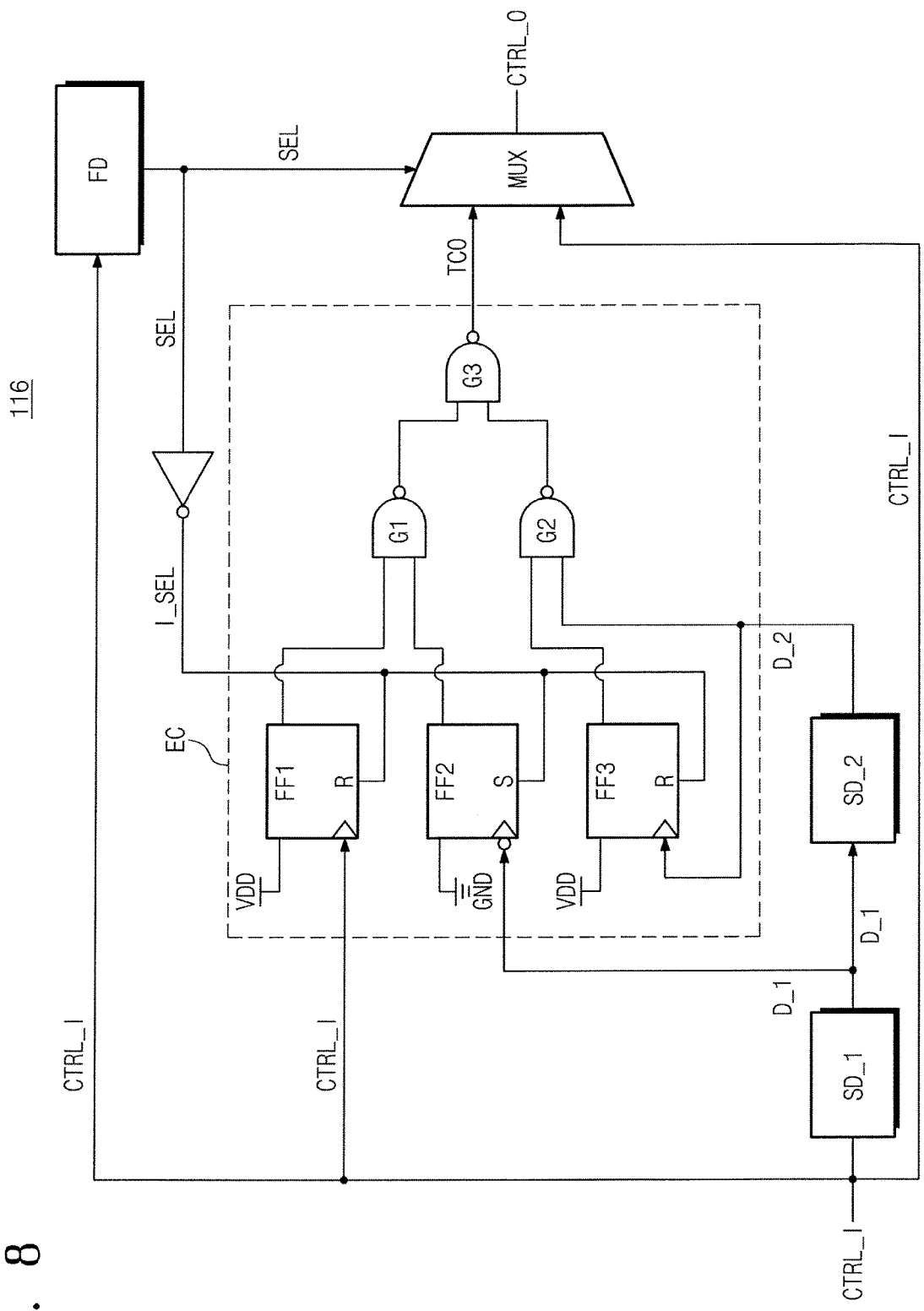
FIG. 8 is a circuit diagram illustrating a timing circuit in accordance with an exemplary embodiment of the inventive concept.

FIG. 8 is a circuit diagram illustrating a timing circuit 116 in accordance with an exemplary embodiment of the inventive concept. An example of the case that N is 2 is illustrated in FIG. 8.

Referring to FIGS. 1 through 8, a timing circuit 116 includes first and second delay circuits SD_1 and SD_2, an edge combiner EC including first through third flip-flops FF1, FF2 and FF3 and first through third gates G1, G2 and G3, a NOT gate (e.g., an inverter), a falling detector (FD) and a multiplexer MUX.

The first time delay circuit SD_1 can delay the received first timing signal CTRL_I by the first delay time d1 to generate the first delay signal D_1. The first time delay circuit SD_1 can output the first delay signal D_1 to the second time delay circuit SD_2 and the internal second flip-flop FF2 of the edge combiner EC. For example, a clock terminal of the second flip-flop FF2 may receive the first delay signal D_1. Subsequently, the second time delay circuit SD_2 can delay the received first delay signal D_1 by the second delay time d2 to generate the second delay signal D_2. The second time delay circuit SD_2 can output the second delay signal D_2 to the internal third flip-flop FF3 and the internal second gate G2 of the edge combiner EC. For example, a clock terminal of the third flip-flop FF3 may receive the second delay signal D_2.

The falling detector FD (e.g., a circuit for detecting a falling edge) can output a selection signal SEL at a low level until a first falling edge of the first timing signal CTRL_I is applied after a level of the first timing signal CTRL_I remains constant for more than a certain period of time. The NOT (e.g., the inverter) gate can receive the selection signal SEL to output an inverting selection signal I_SEL. The inverting selection signal I_SEL may be transmitted to a reset terminal R of the first flip-flop FF1, a set terminal S of the second flip-flop FF2 and a reset terminal R of the third flip-flop FF3. In an embodiment, the reset terminal R is an asynchronous reset terminal such as a preset input of a D flip-flop, and the set terminal S is an asynchronous set terminal such as a clear input of a D flip-flop. In an embodiment, when the preset is activated, the flip-flop will be set (e.g., output terminal Q=1) regardless of the clock signal. In an embodiment, when the clear terminal is activated, the flip-flop will be reset (e.g., output terminal Q=0) regardless of the clock signal.

The first flip-flop FF1 can output a signal generated based on the first timing signal CTRL_I and a power supply voltage VDD to the first gate G1. For example, the first timing signal CTRL_I is applied to the clock terminal of the first flip-flop FF1 and the power supply voltage VDD is applied to the data input terminal of the first flip-flop FF1. For example, the first flip-flop FF1 may be a rising edge trigger D flip-flop. In this case when the inverting selection signal I_SEL is input to a reset terminal R (e.g., an asynchronous reset terminal), an output value of the first flip-flop FF1 is initialized to 0. The output value of the first flip-flop FF1 maintains 0 until a rising edge of the first timing signal CTRL_I is received. Subsequently, the first flip-flop FF1 can transmit an input signal to an output terminal in response to the rising edge of the first timing signal CTRL_I. In this case, since the input signal is the power supply voltage VDD, the output value of the first flip-flop FF1 can maintain 1 until the inverting selection signal I_SEL is re-input.

The second flip-flop FF2 can output a signal generated based on the first delay signal D_1 and a ground voltage signal GND to the first gate G1. For example, the first delay signal D_1 is applied to a clock terminal of the second flip-flop FF2 and the ground voltage GND is applied to the data input terminal of the second flip-flop FF2. For example, the second flip-flop FF2 may be a falling edge trigger D flip-flop. In this case, when the inverting selection signal I_SEL is input to an asynchronous set terminal S, an output value of the second flip-flop FF2 is initialized to 1. The output value of the second flip-flop FF2 maintains 1 until a falling edge of the first delay signal D_1 is received. Subsequently, the second flip-flop FF2 can transmit an input signal to an output terminal in response to the falling edge of the first delay signal D_1. In this case, since the input signal is the ground voltage signal GND, the output value of the second flip-flop FF2 can maintain 0 until the inverting selection signal I_SEL is re-input.

The third flip-flop FF3 can output a signal generated based on the second delay signal D_2 and the power supply voltage VDD to the second gate G2. For example, the second delay signal D_2 is applied to the clock terminal of the third flip-flop FF3 and the power supply voltage VDD is applied to the data input terminal of the third flip-flop FF3. For example, the third flip-flop FF3 may be a rising edge trigger D flip-flop. In this case, when the inverting selection signal I_SEL is input to a reset terminal R (e.g., an asynchronous reset terminal), an output value of the third flip-flop FF3 is initialized to 0. The output value of the third flip-flop FF3 maintains 0 until a rising edge of the second delay signal D_2 is received. Subsequently, the third flip-flop FF3 can transmit an input signal to an output terminal in response to the rising edge of the second delay signal D_2. In this case, since the input signal is the power supply voltage VDD, the output value of the third flip-flop FF3 can maintain 1 until the inverting selection signal I_SEL is re-input.

The first gate G1 can output a result value obtained by performing a logical operation based on an output value of the first flip-flop FF1 and an output value of the second flip-flop FF2 to the third gate G3. The second gate G2 can output a result value obtained by performing a logical operation based on an output value of the third flip-flop FF3 and the second delay signal D_2 to the third gate G3. The third gate G3 can output a timing output signal TCO obtained by performing a logical operation based on an output value of the first gate G1 and an output value of the second gate G2. For example, the first through third gates G1-G3 may be NAND logic gates.

The falling detector FD can output the selection signal SEL to the NOT gate and the multiplexer MUX based on the first timing signal CTRL_I. For example, the falling detector FD can output the selection signal SEL at a high state until a level of the first timing signal CTRL_I remains constant for more than a certain period of time after a first falling edge of the first timing signal CTRL_I is applied. The falling detector FD can also output the selection signal SEL at a low state until the first falling edge of the first timing signal CTRL_I is applied after the level of the first timing signal CTRL_I remains constant for more than a certain period of time.

The NOT gate can invert the selection signal SEL, which is output from the falling detector FD to output the inverted selection signal I_SEL.

The multiplexer MUX selects one of the first timing signal CTRL_I and the timing output signal TCO according to the selection signal SEL to output a second timing signal CTRL_O. For example, in the case that the selection signal SEL is at a low state, the multiplexer MUX can output the first timing signal CTRL_I as the second timing signal CTRL_O. In the case that the selection signal SEL is at a high state, the multiplexer MUX can output the timing output signal TCO as the second timing signal CTRL_O.

Figure 9:
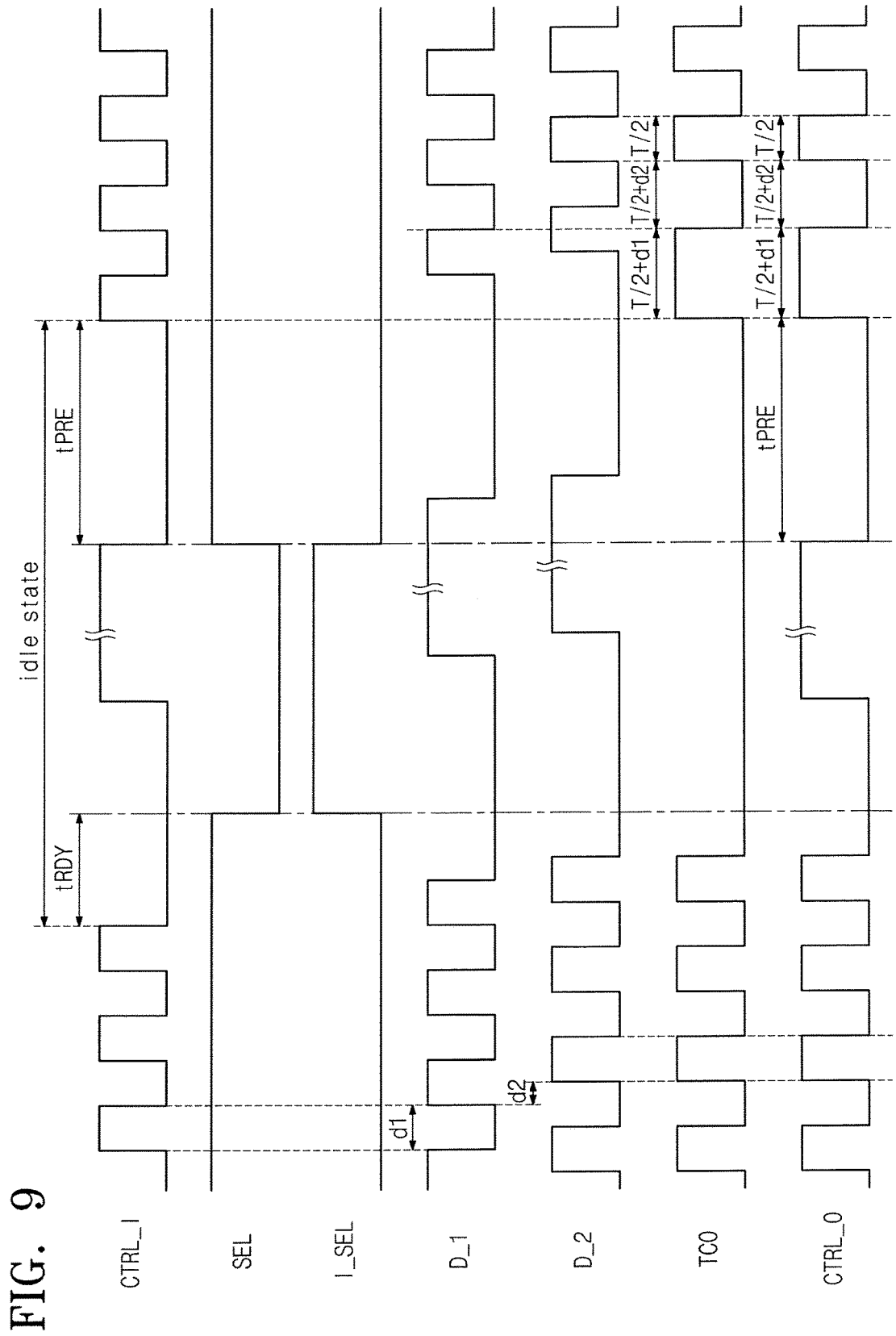
FIG. 9 is a timing diagram illustrating signals which are input to and output from a nonvolatile memory device including a timing circuit in accordance with an exemplary embodiment of the inventive concept.

FIG. 9 is a timing diagram illustrating signals, which are input to and output from a nonvolatile memory device 110 including a timing circuit 116 in accordance with an exemplary embodiment of the inventive concept. Synchronization signals among signals being input to and output from the nonvolatile memory device 110 are not necessarily output at the same time or may be delayed compared with a previous signal to be output.

Referring to FIGS. 8 and 9, the first timing signal CTRL_I is a signal received from the controller 120 and may have a preamble period tPRE. For example, the first timing signal CTRL_I may be a read enable signal RE toggled by the controller 120. The nonvolatile memory device 110 can recognize that a signal having a specific period T and a specific waveform will be input to the first timing signal CTRL_I during the preamble period tPRE. In FIG. 9, the preamble period tPRE of the first timing signal CTRL_I is set to a low level but may be set to a high level depending on a driving method.

The selection signal SEL may be generated if a level of the first timing signal CTRL_I remains constant for more than a certain period of time (tRDY). For example, the selection signal SEL may be output at a low state until the first falling edge of the first timing signal CTRL_I is applied after the level of the first timing signal CTRL_I remains constant for more than a certain period of time (tRDY). The selection signal SEL may be output at a high state until the ready signal READY is received again after the first falling edge of the first timing signal CTRL_I is applied. The inverting selection signal I_SEL that passed through the NOT gate can be output to the first through third flip-flops FF1-FF3 at the same time.

The first delay signal D_1 is a signal generated by delaying the first timing signal CTRL_I received in the first time delay circuit SD_1 by the first delay time d1. For example, in the case of FIG. 9, the first delay time d1 may correspond to half of a period T of the first timing signal CTRL_I.

The second delay signal D_2 is a signal generated by delaying the first delay signal D_1 received in the second time delay circuit SD_2 by the second delay time d2. For example, in the case of FIG. 9, the second delay time d2 may correspond to half of the first delay time d1.

However, the first delay time d1 and the second delay time d2 are not limited thereto and may be differently set depending on embodiments.

The timing output signal TCO may be a signal generated based on the first timing signal CTRL_I received in the edge combiner (EC) and the first and second delay signals D_1 and D_2 output from the first and second time delay circuits SD_1 and SD_2.

For example, a level of the timing output signal TCO rises in synchronization with a rising edge of the first timing signal CTRL_I, falls in synchronization with a falling edge of the first delay signal D_1 and rises in synchronization with a rising edge of the second delay signal D_2. After that, a level of the timing output signal TCO may rise or fall while maintaining its pulse width the same as a pulse width of the first timing signal CTRL_I.

That is, a duration time of a first high level of the timing output signal TCO remains longer than duration time (T/2) of a high level of the first timing signal CTRL_I by the first delay time d1 and duration time of a low level of the timing output signal TCO remains longer than duration time (T/2) of a low level of the first timing signal CTRL_I by the second delay time d2. After that, a duration time of the timing output signal TCO remains the same as the duration time (T/2) of the high and low levels of the first timing signal CTRL_I.

The second timing signal CTRL_O may be a signal generated based on the first timing signal CTRL_I and the timing output signal TCO received in the multiplexer MUX according to the selection signal SEL. For example, in the case that a level of the selection signal SEL is high, the multiplexer MUX can output the timing output signal TCO as the second timing signal CTRL_O. In the case that a level of the selection signal SEL is low, the multiplexer MUX can output the first timing signal CTRL_I as the second timing signal CTRL_O. The second timing signal CTRL_O may be output as it is or the second timing signal CTRL_O may be output while having a high impedance period (Hi-z).

In the case of FIG. 9, the first timing signal CTRL_I may be a read enable signal RE toggled by the memory controller 120 in a read operation of the nonvolatile memory device 110. The second timing signal CTRL_O may be a data strobe signal DQS, which the nonvolatile memory device 110 generates based on the read enable signal RE in a read operation. The nonvolatile memory device 110 can output a read data signal DQ to the controller 120 in synchronization with the second timing signal CTRL_O, that is, the data strobe signal DQS.

Figure 10:
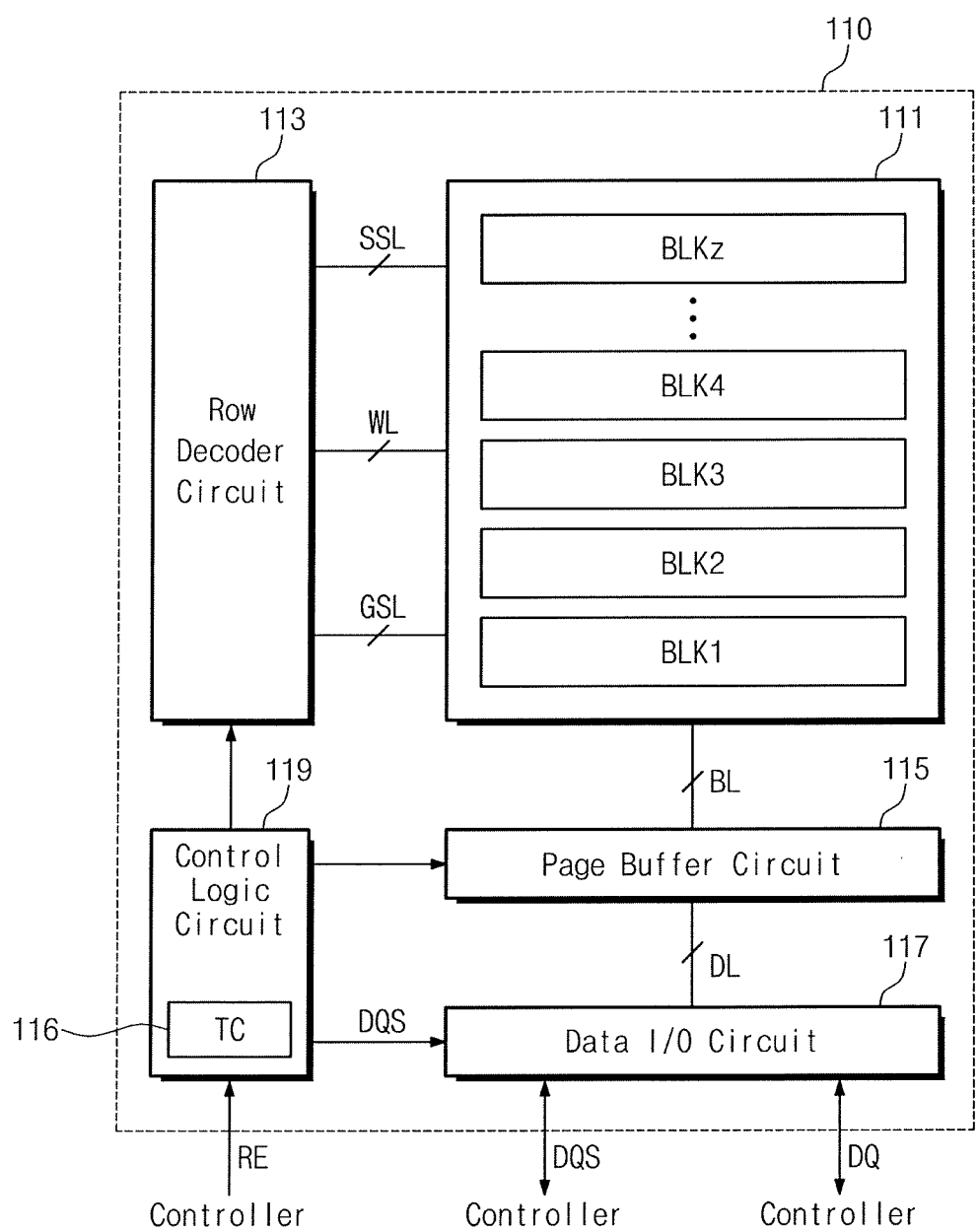
FIG. 10 is a block diagram illustrating a nonvolatile memory device including a timing circuit in accordance with an exemplary embodiment of the inventive concept.

FIG. 10 is a block diagram illustrating a nonvolatile memory device 110 including a timing circuit (TC) 116 in accordance with an exemplary embodiment of the inventive concept.

Referring to FIGS. 1 and 10, the nonvolatile memory device 110 includes a memory cell array 111, a row decoder circuit 113, a page buffer circuit 115, a data input/output circuit 117 and a control logic circuit 119.

The memory cell array 111 includes a plurality of memory blocks BLK1-BLKz. Each memory block includes a plurality of memory cells. Each memory block can be connected to the row decoder circuit 113 through at least one ground select line GSL, a plurality of word lines WL, and at least one string select line SSL. Each memory block can be connected to the page buffer circuit 115 through a plurality of bit lines BL. The memory blocks BLK1-BLKz can be connected to the bit lines BL in common. Memory cells of the memory blocks BLK1-BLKz may have the same structures.

Each of the memory blocks BLK1-BLKz may be an erase operation unit. Memory cells of the memory cell array 111 may be erased by one memory block unit. Memory cells that belong to one memory block may be erased at the same time. Each memory block may be divided into a plurality of sub blocks. Each sub block may be an erase operation unit.

Each of the memory blocks BLK1-BLKz may include a physical storage space recognized by a block address. Each of the word lines WL may correspond to a physical storage space recognized by a row address. Each of the bit lines BL may correspond to a physical storage space recognized by a column address.

The row decoder circuit 113 is connected to the memory cell array 111 through the ground select lines GSL, the word lines WL and the string select lines SSL. The row decoder circuit 113 operates according to a control of the control logic circuit 119. The row decoder circuit 113 can decode an address being received from the controller 120 through an input/output channel and can control voltages being applied to the string select lines SSL, the word lines WL and the ground select lines GSL according to the decoded address.

For example, in a program operation, the row decoder circuit 113 can apply a program voltage VGPM to a selected word line of a memory block selected by an address and can apply a pass voltage VPASS to unselected word lines of the selected memory block. In an embodiment, the program voltage VGPM differs from the pass voltage VPASS. In a read operation, the row decoder circuit 113 can apply a selection read voltage VRD to the selected word line of the memory block selected by the address and can apply an unselect read voltage VREAD to the unselected word lines of the selected memory block. In an embodiment, the selection read voltage VRD differs from the unselect read voltage VREAD. In an erase operation, the row decoder circuit 113 can apply erase voltages (e.g., a ground voltage or low voltages having levels similar to the ground voltage) to word lines of the memory block selected by the address.

The page buffer circuit 115 is connected to the memory cell array 111 through the bit lines BL. The page buffer circuit 115 is connected to the data input/output circuit 117 through a plurality of data lines DL. The page buffer circuit 115 operates according to a control of the control logic circuit 119.

In a program operation, the page buffer circuit 115 can store data to be programmed in memory cells. On the basis of the stored data, the page buffer circuit 115 can apply voltages to the bit lines BL. For example, the page buffer circuit 115 can function as a write driver. In a read operation, the page buffer circuit 115 can sense voltages of the bit lines BL to generate a sensing result and can store the sensing result. For example, the page buffer circuit 115 can function as a sense amplifier.

The data input/output circuit 117 is connected to the page buffer circuit 115 through the data lines DL. The data input/output circuit 117 can output data read by the page buffer circuit 115 to the controller 120 through an input/output channel and can transmit data being received from the controller 120 through the input/output channel to the page buffer circuit 115.

The control logic circuit 119 can receive a command from the controller 120 through the input/output channel and receive a control signal through a control channel. The control logic circuit 119 can operate on a command being received through the input/output channel in response to the control signal, can route an address being received through the input/output channel to the row decoder circuit 113, and can route data being received through the input/output channel to the data input/output circuit 117. The control logic circuit 119 can decode the received command and can control the nonvolatile memory device 110 according to the decoded command. Examples of the command include a read command, a write command, and a delete command.

The control logic circuit 119 may include the timing circuit 116. The timing circuit 116 can receive a read enable signal /RE being received from the controller 120. The timing circuit 116 can generate a signal having a pulse width which is gradually reduced from a pulse width longer than a pulse width of the received read enable signal /RE. At this time, the control logic circuit 119 can generate and output a data strobe signal DQS according to a signal generated from the timing circuit 116. The generated data strobe signal DQS can be output to the controller 120 through the control channel.

Figure 11:
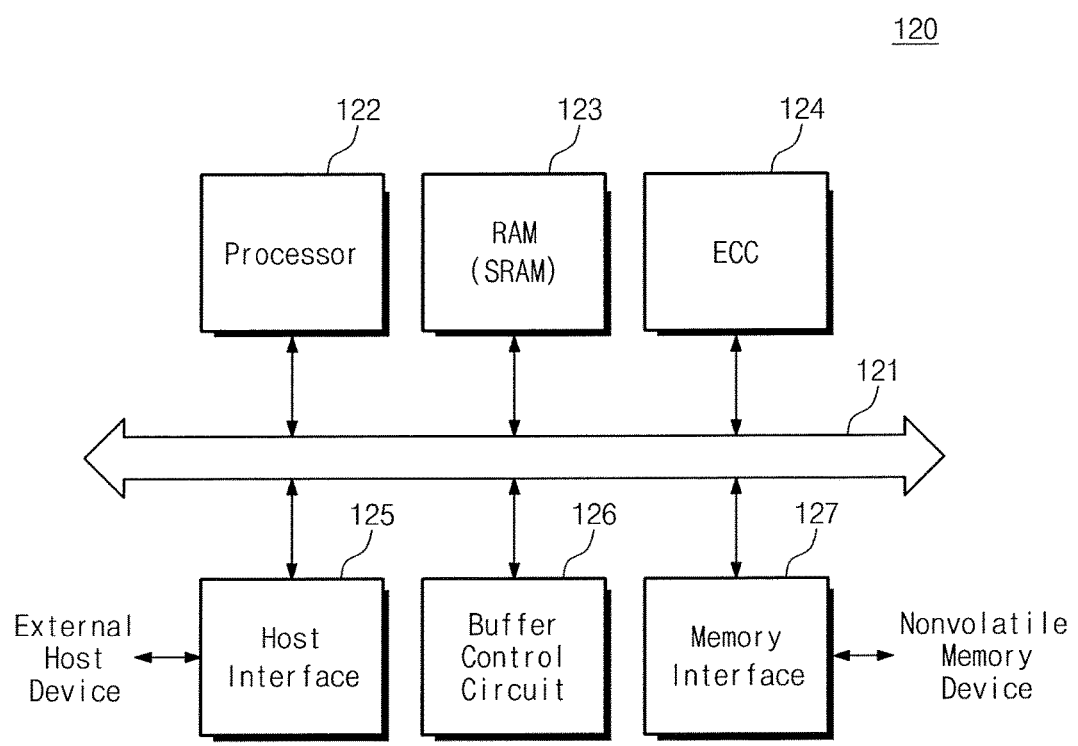
FIG. 11 is a block diagram illustrating a controller in accordance with an exemplary embodiment of the inventive concept.

FIG. 11 is a block diagram illustrating a controller in accordance with an exemplary embodiment of the inventive concept. Referring to FIGS. 1 and 11, the controller 120 includes a bus 121, a processor 122, a RAM 123, an error correction block 124 (e.g., an error correction circuit), a host interface 125, a buffer control circuit 126, and a memory interface 127.

The bus 121 is configured to provide a channel among constituent elements of the controller 120.

The processor 122 can control an overall operation of the controller 120 and can perform a logical operation. The processor 122 can communicate with an external host device through the host interface 125, can communicate with the nonvolatile memory device 110 through the memory interface 127, and can communicate with the RAM 130 through the buffer control circuit 126. The processor 122 can control the storage device 100 using the RAM 123 as an operating memory, a cache memory or a buffer memory.

The RAM 123 may be used as an operating memory, cache memory or buffer memory of the processor 122. The RAM 123 can store codes and commands being executed by the processor 122. The RAM 123 can store data being processed by the processor 122. The RAM 123 may include a SRAM (static RAM).

The error correction block 124 can perform an error correction. The error correction block 124 can perform an error correction encoding based on data to be written in the nonvolatile memory device 110 through the memory interface 127. The error correction encoded data can be transmitted to the nonvolatile memory device 110 through the memory interface 127. The error correction block 124 can perform an error correction decoding on data being received from the nonvolatile memory device 110 through the memory interface 127. The error correction block 124 may be included in the memory interface 127 as a constituent element of the memory interface 127.

The host interface 125 is configured to communicate with an external host device according to a control of the processor 122. The host interface 125 may be configured to communicate using at least one of various communication methods such as a universal serial bus (USB), a serial AT attachment (SATA), a serial attachment SCSI (SAS), a high speed interchip (HSIC), a small computer system interface (SCSI), a peripheral component interconnection (PCI), a PCI express (PCIe), a nonvolatile memory express (NVMe), a universal flash storage (UFS), a secure digital (SD), a multimedia card (MMC), an embedded MMC (eMMC), a dual in-line memory module (DIMM), a registered DIMM (RDIMM), a load reduced DIMM (LRDIMM), etc.

The buffer control circuit 126 is configured to control the RAM 130 according to a control of the processor 122.

The memory interface 127 is configured to communicate with the nonvolatile memory device 110 according to a control of the processor 122. As described with reference to FIG. 1, the memory interface 127 can communicate a command, an address and data to the nonvolatile memory device 110 through the input/output channel. The memory interface 127 can communicate a control signal to the nonvolatile memory device 110 through the control channel.

In the case that the RAM 130 is not provided to the storage device 100, the buffer control circuit 126 may not be provided to the controller 120.

The processor 122 can control the controller 120 using codes. The processor 122 can load codes from a nonvolatile memory device (e.g., read only memory) provided inside the controller 120. The processor 122 can also load codes from the nonvolatile memory device 110 through the memory interface 127.

The bus 121 of the controller 120 may be divided into a control bus and a data bus. The data bus may be configured to transmit data inside the controller 120 and the control bus may be configured to transmit control information such as a command, an address, etc. inside the controller 120. In an embodiment, the data bus and the control bus are separated from each other and do not interfere with or affect each other. The data bus may be connected to the host interface 125, the buffer control circuit 126, the error correction block 124, and the memory interface 127. The control bus may be connected to the host interface 125, the processor 122, the buffer control circuit 126, the RAM 123 and the memory interface 127.

Figure 12:
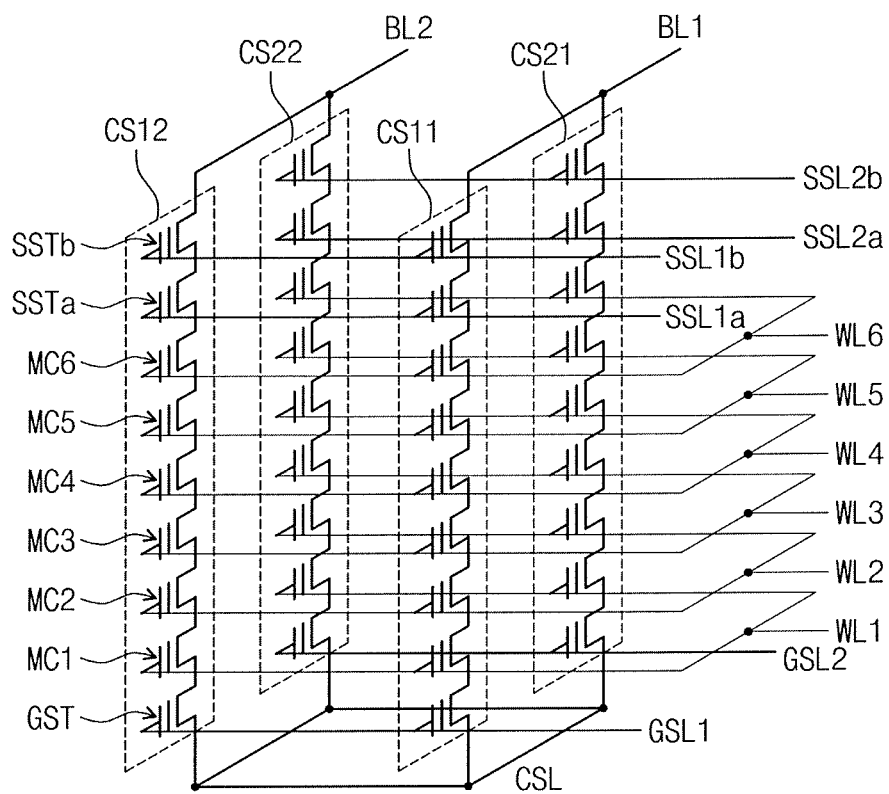
FIG. 12 is a block diagram illustrating a nonvolatile memory device in accordance with an exemplary embodiment of the inventive concept.
Figure 12:
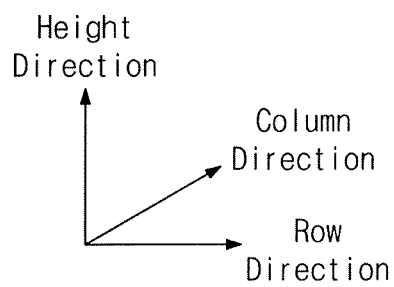

FIG. 12 is a block diagram illustrating a memory block BLKa in accordance with an exemplary embodiment of the inventive concept. Referring to FIG. 12, the memory block BLKa includes a plurality of cell strings (CS11-CS21, CS12-CS22). The cell strings (CS11-CS21, CS12-CS22) may be arranged along a row direction and a column direction to form rows and columns.

For example, the cell strings CS11 and CS12 arranged along the row direction may form a first row and the cell strings CS21 and CS22 arranged along the row direction may form a second row. The cell strings CS11 and CS21 arranged along the column direction may form a first column and the cell strings CS12 and CS22 arranged along the column direction may form a second column.

Each cell string may include a plurality of transistors. The cell transistors include ground select transistors GST, memory cells MC1-MC6, and string select transistors SSTa and SSTb. The ground select transistor GST, the memory cells MC1-MC6 and string select transistors SSTa and SSTb of each cell string may be layered in a height direction perpendicular to a plane (e.g., a plane on a substrate of the memory block BLKa) on which the cell strings (CS11-CS21, CS12-CS22) are arranged along rows and columns.

The cell transistors may be charge trap type transistors having threshold voltages that vary depending on the amounts of charges trapped in an insulating layer.

Sources of the lowermost ground select transistors GST may be connected to a common source line CSL in common.

Control gates of the ground select transistors GST of the cell strings (CS11-CS21, CS12-CS22) may be connected to ground select lines GSL1 and GSL2 respectively. Ground select transistors of the same row may be connected to the same ground select line and ground select transistors of different rows may be connected to different ground select lines. For example, ground select transistors GST of the cell strings CS11 and CS12 of the first row may be connected to the first ground select line GSL1 and ground select transistors GST of the cell strings CS21 and CS22 of the second row may be connected to the second ground select line GSL2.

Control gates of memory cells located at the same height (or order) from a substrate (or ground select transistors GST) may be connected to one word line in common, and control gates of memory cells located at different heights (or orders) from the substrate (or ground select transistors GST) may be connected to different word lines WL1-WL6 respectively. For example, the memory cells MC1 are connected to the word line WL1 in common. The memory cells MC2 are connected to the word line WL2 in common. The memory cells MC3 are connected to the word line WL3 in common. The memory cells MC4 are connected to the word line WL4 in common. The memory cells MC5 are connected to the word line WL5 in common. The memory cells MC6 are connected to the word line WL6 in common.

At first string select transistors SSTa of the same height (or order) of the cell strings (CS11-CS21, CS12-CS22), control gates of the first string select transistors SSTa of different rows are connected to different string select lines SSL1a-SSL2a respectively. For example, the first string select transistors SSTa of the cell strings CS11 and CS12 are connected to the string select line SSL1a in common. The first string select transistors SSTa of the cell strings CS21 and CS22 are connected to the string select line SSL2a in common.

At second string select transistors SSTb of the same height (or order) of the cell strings (CS11-CS21, CS12-CS22), control gates of the second string select transistors SSTb of different rows are connected to different string select lines SSL1b-SSL2b respectively. For example, the second string select transistors SSTb of the cell strings CS11 and CS12 are connected to the string select line SSL1b in common. The second string select transistors SSTb of the cell strings CS21 and CS22 are connected to the string select line SSL2b in common.

That is, cell strings of different rows are connected to different string select lines. String select transistors of the same height (or order) of cell strings of the same row are connected to the same string select line. String select transistors of different heights (or orders) of cell strings of the same row are connected to different string select lines.

String select transistors of cell strings of the same row may be connected to one string select line in common. For example, the string select transistors SSTa and SSTb of the cell strings CS11 and CS12 of the first row may be connected to one string select line in common. The string select transistors SSTa and SSTb of the cell strings CS21 and CS22 of the second row may be connected to one string select line in common.

Columns of the cell strings (CS11-CS21, CS12-CS22) are connected to different bit lines BL1 and BL2 respectively. For example, the string select transistors SSTb of the cell strings CS11-CS21 of the first column are connected to the bit line BL1 in common. The string select transistors SSTb of the cell strings CS12-CS22 of the second column are connected to the bit line BL2 in common.

The cell strings CS11 and CS12 may form a first plane. The cell strings CS21 and CS22 may form a second plane.

In a memory block BLKa, memory cells of each height of each plane may form a physical page. The physical page may be a write unit and a read unit. For example, one plane of the memory block BLKa may be selected by the string select lines SSL1a, SSL1b, SSL2a and SSL2b. When a turn-on voltage is supplied to the string select lines SSL1a and SSL1b and a turn-off voltage is supplied to the string select lines SSL2a and SSL2b, the cell strings CS11 and CS12 of the first plane are connected to the bit lines BL1 and BL2. That is, the first plane is selected. When a turn-on voltage is supplied to the string select lines SSL2a and SSL2b and a turn-off voltage is supplied to the string select lines SSL1a and SSL1b, the cell strings CS21 and CS22 of the second plane are connected to the bit lines BL1 and BL2. That is, the second plane is selected. In the selected plane, one row of the memory cells MC may be selected by the word lines WL1-WL6. In the selected row, a select voltage may be applied to the second word line WL2 and an unselect voltage may be applied to the remaining word lines WL1 and WL3-WL6. That is, a physical page corresponding to the second word line WL2 of the second plane may be selected by adjusting voltages of the string select lines SSL1a, SSL1b, SSL2a and SSL2b and the word lines WL1-WL6. In the memory cells MC2 of the selected physical page, a write or read operation may be performed.

In the memory block BLKa, an erase of the memory cells MC1-MC6 may be performed by a memory block unit or a sub block unit. When an erase operation is performed by a memory block unit, all the memory cells MC of the memory block BLKa may be erased at the same time according to an erase request (e.g., an erase request from an external memory controller). When an erase operation is performed by a sub block unit, a part of the memory cells MC1-MC6 of the memory block BLKa may be erased at the same time according to an erase request and the remaining memory cells may be erase-prohibited. A low voltage (for example, a ground voltage or a voltage having a level similar to the ground voltage) may be supplied to a word line connected to memory cells MC being erased and a word line connected to erase-prohibited memory cells MC may be floated.

The memory block BLKa may include a physical storage space distinguished by a block address. Each of the word lines WL1-WL6 may correspond to a physical storage space distinguished by a row address. Each of the bit lines BL1 and BL2 may correspond to a physical storage space distinguished by a column address. Each of the string select lines (SSL1a, SSL2a or SSL1b, SSL2b) of different rows or the ground select lines GSL1 and GSL2 of different rows may correspond to a physical storage space distinguished by a plane address.

The memory block BLKa illustrated in FIG. 12 is illustrative. A technical spirit of the inventive concept is not limited to the memory block BLKa illustrated in FIG. 12. For example, the number of rows of the cell strings may be increased or decreased. As the number of rows of the cell strings is changed, the number of string select lines or ground select lines connected to the rows of the cell strings and the number of cell strings connected to one bit line may also be changed.

The number of columns of cell strings may be increased or decreased. As the number of columns of cell strings is changed, the number of bit lines connected to the columns of the cell strings and the number of cell strings connected to one string select line may also be changed.

A height of the cell strings may be increased or decreased. For example, the number of ground select transistors, memory cells or string select transistors layered on each of the cell strings may be increased or decreased.

Memory cells MC that belong to one physical page may correspond to at least three logical pages. For example, k (k is a positive integer greater than 2) number of bits may be programmed in one memory cell MC. In memory cells MC that belong to one physical page, k number of bits being programmed in each memory cell MC can form k number of logical pages respectively.

For example, one physical page includes a physical storage space distinguished by a block address, a row address, a column address, and a plane address. One physical page may include two or more logical pages. Each of the logical pages may include a logical storage space distinguished by an additional address (or offset) distinguishing the logical pages in addition to an address of the physical page.

In an embodiment of the present inventive concept, a three dimensional (3D) memory array is provided. The 3D memory array is monolithically formed in one or more physical levels of arrays of memory cells having an active area disposed above a silicon substrate and circuitry associated with the operation of those memory cells, whether such associated circuitry is above or within such substrate. The term "monolithic" means that layers of each level of the array are directly deposited on the layers of each underlying level of the array.

In an embodiment of the present inventive concept, the 3D memory array includes vertical NAND strings that are vertically oriented such that at least one memory cell is located over another memory cell. The at least one memory cell may comprise a charge trap layer. Each vertical NAND string may include at least one select transistor located over memory cells, the at least one select transistor having the same structure with the memory cells and being formed monolithically together with the memory cells.

The following patent documents, which are hereby incorporated by reference, describe suitable configurations for three-dimensional memory arrays, in which the three-dimensional memory array is configured as a plurality of levels, which word lines and/or bit lines shared between levels: U.S. Pat. Nos. 7,679,133; 8,553,466; 8,654,587; 8,559,235; and US Pat. Pub. No. 2011/0233648.

Figure 13:
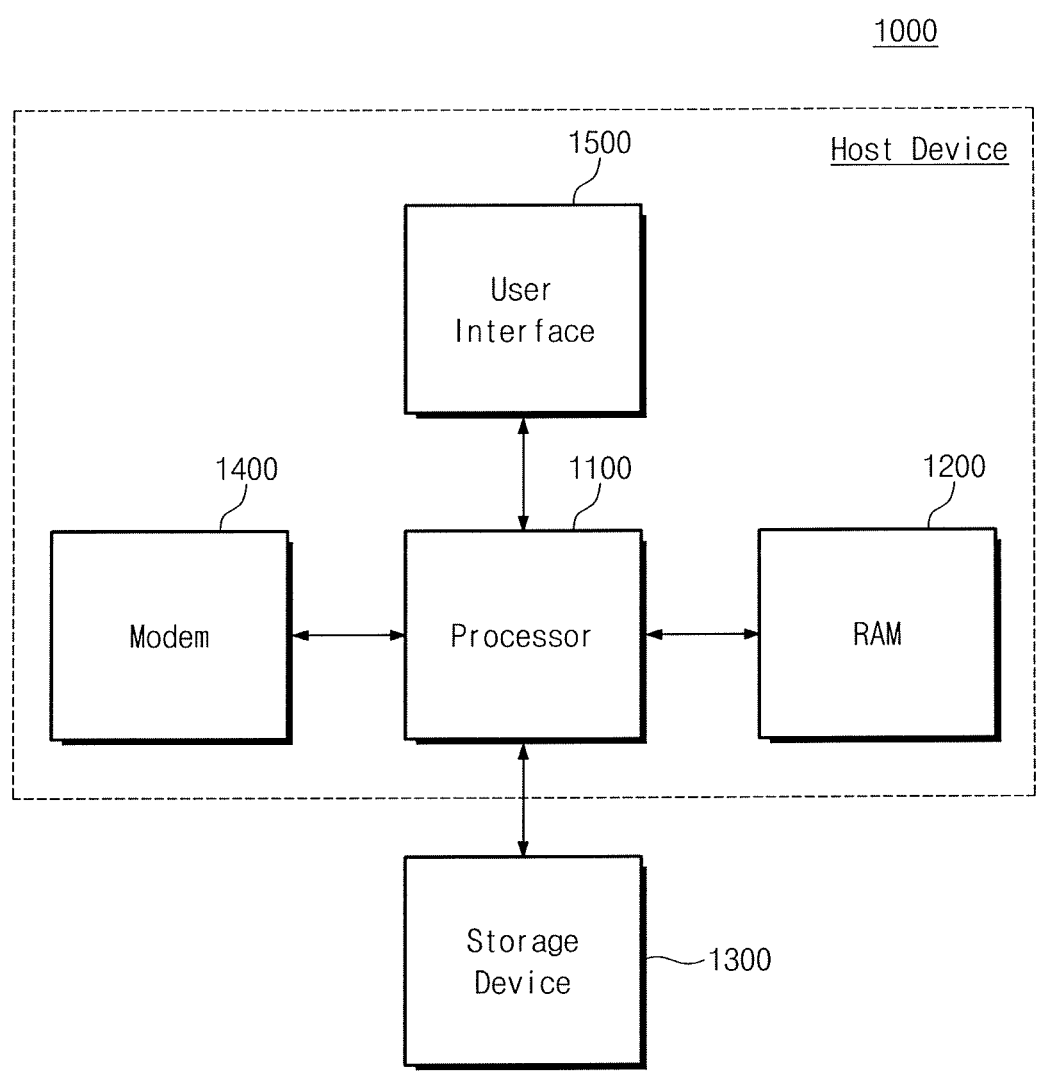
FIG. 13 is a block diagram illustrating a computing device in accordance with an exemplary embodiment of the inventive concept.

FIG. 13 is a block diagram illustrating a computing device 1000 in accordance with an exemplary embodiment of the inventive concept. Referring to FIG. 13, the computing device 1000 includes a processor 1100, a memory 1200, a storage device 1300, a modem 1400, and a user interface 1500.

The processor 1100 can control an overall operation of the computing device 1000 and perform a logical operation. For example, the processor 1100 can be constituted by a system-on-chip SoC. The processor 1100 may be a general purpose processor, a special purpose processor, or an application processor.

The RAM 1200 can communicate with the processor 1100. The RAM 1200 may be a main memory of the processor 1100 or the computing device 1000. The processor 1100 can temporarily store a code or data in the RAM 1200. The processor 1100 can execute a code and process data using the RAM 1200. The processor 1100 can execute various software such as an operating system, an application, etc. using the RAM 1200. The processor 1100 can control an overall operation of the computing device 1000 using the RAM 1200. The RAM 1200 may include a volatile memory such as a SRAM, a DRAM, a SDRAM, etc. and a nonvolatile memory such as a PRAM, a MRAM, an RRAM, a FeRAM, etc.

The storage device 1300 can communicate with the processor 1100. The storage device 1300 can store data which has to be preserved for a long time. That is, the processor 1100 can store data which has to be preserved for a long time in the storage device 1300. The storage device 1300 can store a boot image to drive the computing device 1000. The storage device 1300 can store source codes of various software such as an operating system, an application, etc. The storage device 1300 can store data processed by various software such as an operating system, an application, etc.

The processor 1100 can drive various software such as an operating system, an application, etc. by loading source codes stored in the storage device 1300 into the RAM 1200 and executing the codes loaded into the RAM 1200. The processor 1100 can load data stored in the storage device 1300 into the RAM 1200 and process data loaded into the RAM 1200. The processor 1100 can store data desired to be preserved for a long time among data stored in the RAM 1200 in the storage device 1300.

The storage device 1300 may include a nonvolatile memory such as a flash memory, a PRAM, a MRAM an RRAM, a FRAM, etc.

The modem 1400 can perform a communication with an external device according to a control of the processor 1100. For example, the modem 1400 can perform a wired or wireless communication with an external device. The modem 1400 can perform a communication based on at least one of various wireless communication methods such as a long term evolution (LTE), a WiMax, a global system for mobile communication (GSM), a code division multiple access (CDMA), a Bluetooth, a near field communication (NFC), a WiFi, a radio frequency Identification (RFID), or at least one of various wired communication methods such as a universal serial bus (USB), a serial at attachment (SATA), a small computer small interface (SCSI), a Firewire, a peripheral component interconnection (PCI), a PCI express (PCIe), a nonvolatile memory express (NVMe), a universal flash storage (UFS), a secure digital (SD), a SDIO, a universal asynchronous receiver transmitter (UART), a SPI (serial peripheral interface), a high speed SPI (HS-SPI), a RS232, an inter-integrated circuit (I2C), a HS-I2C, an integrated-interchip sound (I2S), a sony/philips digital interface (S/PDIF), a multimedia card (MMC), an embedded MMC (eMMC), etc.

The user interface 1500 can communicate with a user under the control of the processor 1100. For example, the user interface 1500 may include user input interfaces such as a keyboard, a keypad, a button, a touch panel, a touch screen, a touch pad, a touch ball, a camera, a mike, a gyroscope sensor, a vibration sensor, a piezoelectric element, etc. The user interface 1500 may include user output interfaces such as a liquid crystal display (LCD), an organic light emitting diode (OLED) display, an active matrix OLED (AMOLED) display, a LED, a speaker, a motor, etc.

The data storage device 1300 may include storage device 100. The processor 1100, the RAM 1200, the modem 1400 and the user interface 1500 may form a host device communicating with the data storage device 1300.

According to an exemplary embodiment of the inventive concept, a second timing signal generated from a first timing signal has a pulse width, which is gradually reduced from a pulse width greater than a pulse width of the first timing signal. Thus, collapse of a waveform of the second timing signal may be prevented, and a semiconductor memory system and a semiconductor memory device having improved reliability and a method of operating the semiconductor memory device may be provided.

While the present inventive concept has been particularly shown and described with reference to exemplary embodiments thereof, it will be understood by those of ordinary skill in the art that various changes in form and details may be made therein without departing from the spirit and scope of the present inventive concept.

What is claimed is:

1. A semiconductor memory device comprising:
   a timing circuit configured to receive a first timing signal having a first pulse width from an external device and output a second timing signal having a pulse width that is gradually reduced from a second pulse width longer than the first pulse width to a third pulse width shorter than the second pulse width; and
   a data input/output circuit receiving the second timing signal and outputting data to the external device in synchronization with the second timing signal.

2. The semiconductor memory device of claim 1, the pulse width of the second timing signal remains constant after the pulse width of the second timing signal has been gradually reduced to be equal to the first pulse width of the first timing signal.

3. The semiconductor memory device of claim 1, wherein a width of a first high level of the second timing signal remains longer than a width of a first high level of the first timing signal by a first delay time, a width of a first low level of the second timing signal remains longer than a width of a first low level of the first timing signal by a second delay time, and after that, widths of high and low levels of the second timing signal become equal to widths of high and low levels of the first timing signal.

4. A semiconductor memory system comprising:
   a semiconductor memory device including memory blocks; and a memory controller configured to control the semiconductor memory device and transmit a first timing signal to the semiconductor memory device, wherein the semiconductor memory device is configured to receive the first timing signal having a first pulse width and generate a second timing signal having a pulse width that is gradually reduced from a second pulse width longer than the first pulse width to a third pulse width shorter than the second pulse width, and then output the generated second timing signal to the memory controller.

5. The semiconductor memory system of claim 4, wherein the semiconductor memory device comprises a timing circuit that generates a timing output signal based on the first timing signal.

6. The semiconductor memory system of claim 5, wherein the timing circuit comprises:
a plurality of time delay circuits serially connected to one another, where each time delay circuit delays a signal for a different delay time; and
an edge combiner circuit outputting the timing output signal based on the first timing signal and output signals of the time delay circuits.

7. The semiconductor memory system of claim 6, wherein the different delay times of the time delay circuits are sequentially reduced.

8. The semiconductor memory system of claim 6, wherein the time delay circuits comprise:
a first time delay circuit receiving the first timing signal and outputting a first delay signal obtained by delaying the first timing signal by a first delay time; and
a second time delay circuit receiving the first delay signal and outputting a second delay signal obtained by delaying the first delay signal by a second delay time, wherein the timing circuit comprises:
a ready signal generator outputting a ready signal when a level of the first timing signal remains constant for more than a certain period of time.

9. The semiconductor memory system of claim 8, wherein the first delay signal is a signal delayed by ½ period compared with the first timing signal, and
wherein the second delay signal is a signal delayed by ¾ period compared with the first timing signal.

10. The semiconductor memory system of claim 8, wherein the edge combiner circuit comprises:
a first flip-flop of which an asynchronous reset terminal receives the ready signal, the first flip-flop outputting a signal generated based on the first timing signal and a power supply voltage;
a second flip-flop of which an asynchronous set terminal receives the ready signal, the second flip-flop outputting a signal generated based on the first delay signal and a ground voltage;
a third flip-flop of which an asynchronous reset terminal receives the ready signal, the third flip-flop outputting a signal generated based on the second delay signal and the power supply voltage;
a first gate performing a logical operation on an output value of the first flip-flop and an output value of the second flip-flop;
a second gate performing a logical operation an output value of the third flip-flop and the second delay signal; and
a third gate performing a logical operation on outputs of the first gate and the second gate.

11. The semiconductor memory system of claim 10, wherein the first flip-flop is a rising edge trigger D flip-flop, the second flip-flop is a falling edge trigger D flip-flop, the third flip-flop is a rising edge trigger D flip-flop, and the first through third gates comprise NAND logic gates.

12. The semiconductor memory system of claim 8, wherein the ready signal generator comprises:
a transition detector outputting a non-transition signal when a level of the first timing signal remains constant for more than a certain period of time; and
a pulse generator generating a ready signal which rises in synchronization with a rising edge of the non-transition signal and falls before a rising edge of the first timing signal.

13. The semiconductor memory system of claim 4, wherein the semiconductor memory device comprises a data input/output circuit outputting data to the external device in synchronization with the second timing signal.

14. The semiconductor memory system of claim 13, wherein the first timing signal is a Read enable (RE) signal toggled by the memory controller in a read operation of the nonvolatile memory device,
wherein the data is read data; and
wherein the second timing signal is a Data strobe signal (DQS) which the nonvolatile memory device generates based on the Read enable (RE) signal in a read operation.

15. The semiconductor memory system of claim 4, wherein each of the memory blocks of the nonvolatile memory device comprises cell strings disposed on a substrate,
wherein each of the cell strings comprises at least one select transistor and memory cells layered in a direction perpendicular to the substrate on the substrate, and
wherein each of the at least one select transistor and the memory cells comprises a charge trap layer.

16. A semiconductor memory device comprising:
a timing circuit configured to receive a first timing signal including pulses of a first pulse width from an external device and output a second timing signal sequentially including a first pulse having a second pulse width larger than the first pulse width and a plurality of second pulses of the first pulse width; and
a data input/output circuit receiving the second timing signal and outputting data to the external device in synchronization with the second timing signal.

17. The semiconductor memory device of claim 16, wherein the timing circuit comprises:
a plurality of time delay circuits serially connected to one another, where each time delay circuit delays a signal for a different delay time;
an edge combiner circuit outputting a timing output signal based on the first timing signal and output signals of the time delay circuits; and
a multiplexer configured to output one of the timing output signal and the first timing signal in response to a selection signal.

18. The semiconductor memory device of claim 17, further comprising:
a falling edge detector configured to output the selection signal at a low level until a falling edge of the first timing signal is applied after a level of the first timing signal remains constant for more than a certain period of time; and
an inverter inverting the selection signal to generate an inverted signal.

19. The semiconductor memory device of claim 18, wherein the edge combiner circuit comprises:

a first flip-flop of which an asynchronous reset terminal receives the inverted signal, the first flip-flop outputting a signal generated based on the first timing signal and a power supply voltage;

a second flip-flop of which an asynchronous set terminal receives the inverted signal, the second flip-flop outputting a signal generated based on the first delay signal and a ground voltage;

a third flip-flop of which an asynchronous reset terminal receives the inverted signal, the third flip-flop outputting a signal generated based on the second delay signal and the power supply voltage.

20. The semiconductor memory device of claim 19, wherein the edge combiner circuit further comprises:

a first gate performing a logical operation on an output value of the first flip-flop and an output value of the second flip-flop;

a second gate performing a logical operation an output value of the third flip-flop and the second delay signal; and a third gate performing a logical operation on outputs of the first gate and the second gate.

\* \* \* \* \*